United States Patent
Wang et al.

(10) Patent No.: US 12,489,102 B2
(45) Date of Patent: Dec. 2, 2025

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qiwei Wang, Beijing (CN); Jun Yan, Beijing (CN); Rong Wang, Beijing (CN); Fan He, Beijing (CN); Cong Fan, Beijing (CN); Xiangdan Dong, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/250,392

(22) PCT Filed: May 30, 2022

(86) PCT No.: PCT/CN2022/096054
§ 371 (c)(1),
(2) Date: Apr. 25, 2023

(87) PCT Pub. No.: WO2023/230783
PCT Pub. Date: Dec. 7, 2023

(65) Prior Publication Data
US 2024/0387488 A1 Nov. 21, 2024

(51) Int. Cl.
*H01L 25/16* (2023.01)
*H10D 86/40* (2025.01)
(Continued)

(52) U.S. Cl.
CPC ......... *H01L 25/167* (2013.01); *H10D 86/441* (2025.01); *H10D 86/60* (2025.01); *H10H 20/857* (2025.01); *H10H 29/142* (2025.01)

(58) Field of Classification Search
CPC .... H01L 25/167; H10D 86/441; H10D 86/60; H10H 20/857; H10H 29/142;
(Continued)

(56) References Cited

U.S. PATENT DOCUMENTS

2013/0241906 A1 9/2013 Asano
2021/0012706 A1 1/2021 Yang et al.
(Continued)

FOREIGN PATENT DOCUMENTS

| CN | 109377929 A | 2/2019 |
|---|---|---|
| CN | 109686311 A | 4/2019 |

(Continued)

OTHER PUBLICATIONS

Extended European Search Report for corresponding Application No. 22944125.8, dated Mar. 5, 2025, 15 pages.

*Primary Examiner* — Elmito Breval
(74) *Attorney, Agent, or Firm* — Dority & Manning, P.A.

(57) ABSTRACT

A display substrate has a main display region and a light-transmissive display region. The display substrate includes a plurality of pixel circuits located in the main display region and including first pixel circuits and second pixel circuits, and a plurality of light-emitting devices including first light-emitting devices located in the main display region and second light-emitting devices located in the light-transmissive display region. The first pixel circuits include pixel circuits of a first type and pixel circuits of a second type, and the second pixel circuits include pixel circuits of the first type and pixel circuits of the second type. A pixel circuit of the first type and a pixel circuit of the second type have (Continued)

different structures. At least two second light-emitting devices of a same color and arranged in succession in a first direction are coupled to pixel circuit(s) of a same type in the second pixel circuits.

20 Claims, 14 Drawing Sheets

(51) Int. Cl.
  *H10D 86/60* (2025.01)
  *H10H 20/857* (2025.01)
  *H10H 29/14* (2025.01)
(58) Field of Classification Search
  CPC ... G09G 2300/0426; G09G 2300/0452; G09G 2300/0842; G09G 2310/0251; G09G 2310/0262; G09G 3/3233
  See application file for complete search history.

(56) References Cited

U.S. PATENT DOCUMENTS

| | | | |
|---|---|---|---|
| 2022/0102421 A1* | 3/2022 | Yang | .................... H10H 20/857 |
| 2022/0157895 A1 | 5/2022 | Xu et al. | |
| 2022/0310706 A1 | 9/2022 | Yi et al. | |
| 2024/0062720 A1 | 2/2024 | Ma et al. | |

FOREIGN PATENT DOCUMENTS

| | | |
|---|---|---|
| CN | 112038373 A | 12/2020 |
| CN | 112186021 A | 1/2021 |
| CN | 112466209 A | 3/2021 |
| CN | 113096601 A | 7/2021 |
| CN | 113178163 A | 7/2021 |
| CN | 113421896 A | 9/2021 |
| CN | 113823641 A | 12/2021 |
| JP | 2010139966 | 6/2010 |
| WO | WO2022095229 A1 | 5/2022 |

* cited by examiner

DISPLAY SUBSTRATE AND DISPLAY APPARATUS

CROSS-REFERENCE TO RELATED APPLICATION

This application is a national phase entry under 35 USC 371 of International Patent Application No. PCT/CN2022/096054, filed on May 30, 2022, which is incorporated herein by reference in its entirety.

TECHNICAL FIELD

The present disclosure relates to the field of display technologies, and in particular, to a display substrate and a display apparatus.

BACKGROUND

In order to improve a visual effect of a display screen, it is necessary to increase a proportion of a display region of the display screen as much as possible, that is, to increase a screen-to-body ratio of the display screen. The display screen with the screen-to-body ratio of 100% or approximately 100% is generally referred to as a "full screen".

At present, the full screen of the display apparatus may adopt an under-screen camera technology. That is, the camera is arranged under the display screen, so that a region of the display screen corresponding to the camera can also perform display. Therefore, it may prevent a front camera from occupying a display region of the display screen, and thus facilitate the screen-to-body ratio of the display screen to approach or reach 100%, thereby achieving the full screen.

SUMMARY

In an aspect, a display substrate is provided. The display substrate has a main display region and a light-transmissive display region, and the main display region is located on at least one side of the light-transmissive display region. The display substrate includes a plurality of pixel circuits and a plurality of light-emitting devices. The plurality of pixel circuits are located in the main display region, and include first pixel circuits and second pixel circuits. The first pixel circuits include pixel circuits of a first type and pixel circuits of a second type, and the second pixel circuits include pixel circuits of the first type and pixel circuits of the second type. In the plurality of pixel circuits, one of two adjacent pixel circuits in a first direction is a pixel circuit of the first type, and another of the two adjacent pixel circuits is a pixel circuit of the second type. The pixel circuit of the first type and the pixel circuit of the second type have different structures.

The plurality of light-emitting devices include first light-emitting devices located in the main display region and second light-emitting devices located in the light-transmissive display region. The first light-emitting devices are coupled to the first pixel circuits, and the second light-emitting devices are coupled to the second pixel circuits. In the first direction, at least two second light-emitting devices of a same color and arranged in succession are both coupled to at least one pixel circuit of a same type in the second pixel circuits.

In some embodiments, all second light-emitting devices of the same color are each coupled to a pixel circuit of the first type in the second pixel circuits; or all the second light-emitting devices of the same color are each coupled to a pixel circuit of the second type in the second pixel circuits.

In some embodiments, at least one second pixel circuit is coupled to at least one second light emitting device.

In some embodiments, a single second pixel circuit is coupled to a single second light-emitting device; or the single second pixel circuit is coupled to the at least two second light-emitting devices of the same color.

In some embodiments, the light-transmissive display region of the display substrate includes a plurality of display unit areas, and a display unit area includes a plurality of second light-emitting devices in the second light-emitting devices located in the light-transmissive display region. Two second light-emitting devices belonging to two adjacent display unit areas and of the same color are coupled to a same second pixel circuit.

In some embodiments, the light-transmissive display region of the display substrate includes a plurality of display unit areas, and a display unit area includes two second light-emitting devices of the same color. The two second light-emitting devices of the same color in the display unit area are coupled to a same second pixel circuit.

In some embodiments, the display substrate further includes first conductive lines. The main display region of the display substrate includes a plurality of sub-pixel areas. A first light-emitting device and a second pixel circuit are located in a same sub-pixel area. A first pixel circuit is coupled to the first light-emitting device located in the same sub-pixel area as the second pixel circuit through a first conductive line.

In some embodiments, a light-emitting device includes an anode, a light-emitting layer and a cathode layer that are sequentially stacked in a direction away from the substrate. At least one first conductive line is disposed in a same layer as the anode of the light-emitting device.

In some embodiments, the display substrate further includes second conductive lines. A second pixel circuit is coupled to a second light-emitting device through a second conductive line.

In some embodiments, the display substrate further includes first conductive lines. The main display region of the display substrate includes a plurality of sub-pixel areas. A first light-emitting device and the second pixel circuit are located in a same sub-pixel area. The first light-emitting device in the same sub-pixel area as the second pixel circuit is coupled to a first pixel circuit in another sub-pixel area through a first conductive line, and a color of another first light-emitting device in the another sub-pixel area is different from a color of the second light-emitting device to which the second pixel circuit located in the same sub-pixel area as the first light-emitting device is coupled through the second conductive line.

In some embodiments, the display substrate includes a transparent conductive layer. In a second direction, the transparent conductive layer is located between the plurality of pixel circuits and the plurality of light-emitting devices. The second direction intersects the first direction and is perpendicular to the display substrate. The transparent conductive layer includes the second conductive lines.

In some embodiments, the transparent conductive layer includes a plurality of transparent conductive films disposed to be insulated from each other in the second direction. Different transparent conductive films include second conductive lines coupled to second light-emitting devices of different colors, and second conductive lines coupled to second light-emitting devices of the same color are located in a same transparent conductive film.

In some embodiments, two second light-emitting devices of the same color are connected to two second pixel circuits, respectively. A second light-emitting device of the two second light-emitting devices proximate to the main display region is coupled to a second pixel circuit of the two second pixel circuits proximate to the light-transmissive display region. Another second light-emitting device of the two second light-emitting devices far away from the main display region is coupled to another second pixel circuit of the two second pixel circuits far away from the light-transmissive display region. In some embodiments, in two adjacent second pixel circuits in the first direction, a pixel circuit of the first type and a pixel circuit of the second type are coupled to second light-emitting devices of different colors, respectively.

In some embodiments, a first light-emitting device and a second light-emitting device of a same color are coupled to a pixel circuit of the first type in the first pixel circuits and a pixel circuit of the first type in the second pixel circuits, respectively; or the first light-emitting device and the second light-emitting device of the same color are coupled to a pixel circuit of the second type in the first pixel circuits and a pixel circuit of the second type in the second pixel circuits, respectively.

In some embodiments, the light-transmissive display region of the display substrate includes a plurality of display unit areas, and a display unit area includes one second light-emitting device of a first color, two second light-emitting devices of a second color and one second light-emitting device of a third color. The second light-emitting device of the first color and the second light-emitting device of the third color are each coupled to a pixel circuit of the first type in the second pixel circuits. The second light-emitting devices of the second color are each coupled to a pixel circuit of the second type in the second pixel circuits.

In some embodiments, the pixel circuit of the first type and the pixel circuit of the second type that are adjacent in the first direction are two pixel circuits arranged in a mutual mirror image manner.

In some embodiments, in the first direction, at least one second pixel circuit is located between two first pixel circuits; and/or in the first direction, at least one first pixel circuit is located between two second pixel circuits.

In some embodiments, the main display region includes a transition region and a remaining display region. The transition region at least partially surrounds the light-transmissive display region, and the remaining display region at least partially surrounds the transition region. The second pixel circuits are located at least in the transition region, and the first pixel circuits are located in the remaining display region and the transition region.

In another aspect, a display apparatus is provided. The display apparatus includes a display substrate and an optical sensor. The display substrate is the display substrate as described in any of the above embodiments. The optical sensor is located on a side of a back surface of the display substrate, and the back surface of the display substrate is a surface opposite to a display surface of the display substrate. A light-collecting region of the optical sensor at least partially overlaps with the light-transmissive display region of the display substrate.

BRIEF DESCRIPTION OF THE DRAWINGS

In order to describe technical solutions in some embodiments of the present disclosure more clearly, the accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
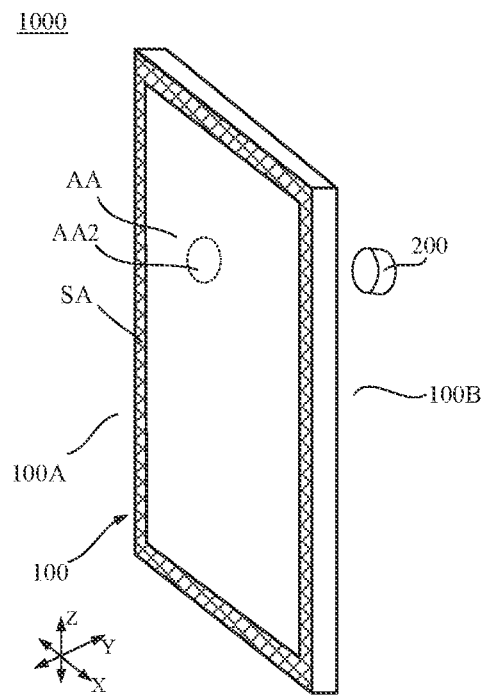
FIG. 1 is a structural diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display apparatus. The display apparatus is a product having an image (including a still image or a moving image, where the moving image may be a video) display function. For example, the display apparatus may be any of a display, a television, a billboard, a digital photo frame, a laser printer with a display function, a telephone, a mobile phone, a painting screen, a personal digital assistant (PDA), a digital camera, a camcorder, a viewfinder, a navigator, a vehicle, a large-area wall, an information search device (e.g., a business search device in a department such as an electronic government, a bank, a hospital or an electric power department), a monitor, and the like. For another example, the display apparatus may be any of a microdisplay, a virtual reality (VR) device including a microdisplay, an augmented reality (AR) device including a microdisplay, and the like.

Figure 2:
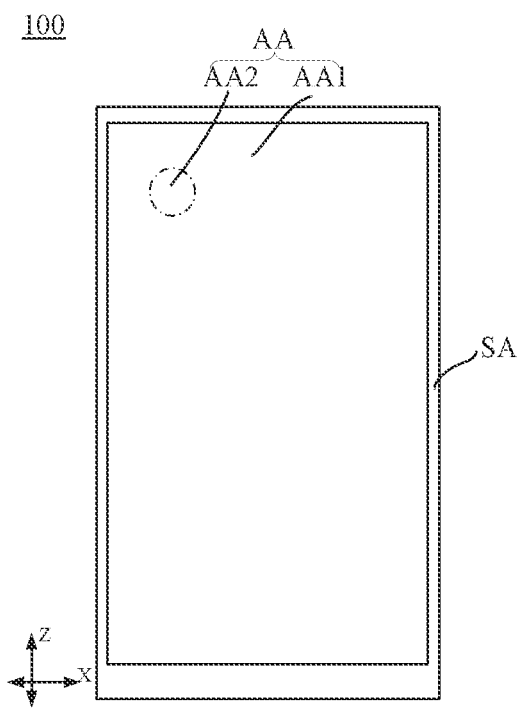
FIG. 2 is a structural diagram of a display substrate, in accordance with some embodiments.

FIG. 1 is a perspective view of the display apparatus. FIG. 2 is a front view of the display apparatus.

Reference to FIGS. 1 and 2, the display apparatus 1000 may include a display substrate 100 and an optical sensor 200. The display substrate 100 is a flat panel capable of displaying an image. For example, the display substrate 100 may be referred to as a screen, and may be a liquid crystal display substrate 100, an organic light emitting display substrate 100, or the like.

Referring to FIG. 1, the display substrate 100 has a display surface 100A and a non-display surface (i.e., a back surface of the display substrate 100) 100B. The display surface 100A is a surface of the display substrate 100 capable of displaying images. When a human eye is on a side of the display surface 100A, the images displayed on the display substrate 100 may be viewed. The non-display surface 100B is opposite to the display surface 100A. The optical sensor 200 is disposed on a side of the non-display surface 100B of the display substrate 100, and thus the optical sensor 200 may be referred to as an under-screen sensor. Since the optical sensor 200 needs to receive light signals transmitted through the display substrate 100 from the outside, the display substrate 100 needs to have a relatively high light transmittance in the region corresponding to the optical sensor 200. Based on this, the display substrate 100 may have a display region AA and a peripheral region SA. An X direction in FIG. 1 is an extending direction of a side of the display region AA, such as an extending direction of a short side, or a transverse direction of the display region AA. A Y direction is a direction perpendicular to a plane where the display substrate 100 is located. A Z direction is an extending direction of another side of the display region AA, such as an extending direction of a long side, or a longitudinal direction of the display region AA. The X direction, the Y direction and the Z direction in the following drawings are defined in the same manner.

Referring to FIG. 2, the peripheral region SA is located on at least one side (e.g., one side; or four sides, including upper and lower sides and left and right sides) outside the display region AA. The display region AA may include a main display region AA1 and a light-transmissive display region AA2 corresponding to the optical sensor 200, and the main display region AA1 and the light-transmissive display region AA2 do not overlap with each other. The light transmittance of the light-transmissive display region AA2 may be higher than that of the main display region AA1.

An orthogonal projection of a light-collecting region of the optical sensor 200 on the display substrate 100 at least partially overlaps with the light-transmissive display region AA2, so that a relatively large amount of light can pass through the display substrate 100 to be received by the optical sensor 200. For example, a portion of the orthogonal projection of the light-collecting region of the optical sensor 200 on the display substrate 100 is located within the light-transmissive display region AA2. For another example, all of the orthogonal projection of the light-collecting region of the optical sensor 200 on the display substrate 100 is located within the light-transmissive display region AA2. The main display region AA1 is a region in the display region AA other than the light-transmissive display region AA2.

Some embodiments of the present disclosure provide a display substrate 100. The display substrate 100 may be included in the display apparatus 1000.

Figure 3A:
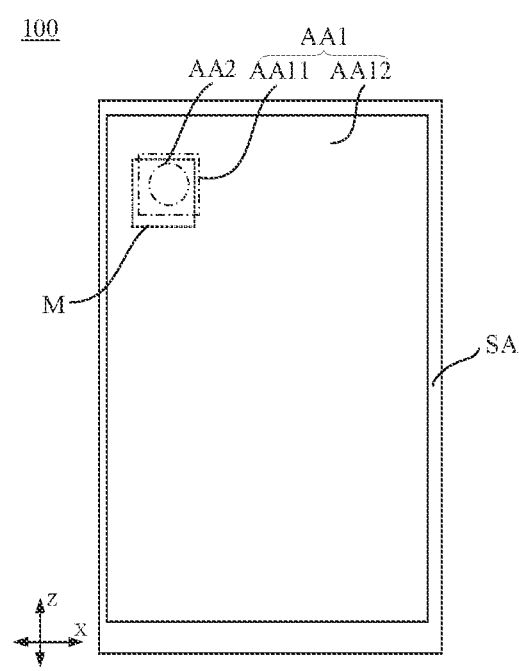
FIG. 3A is a structural diagram of another display substrate, in accordance with some embodiments.
Figure 3B:
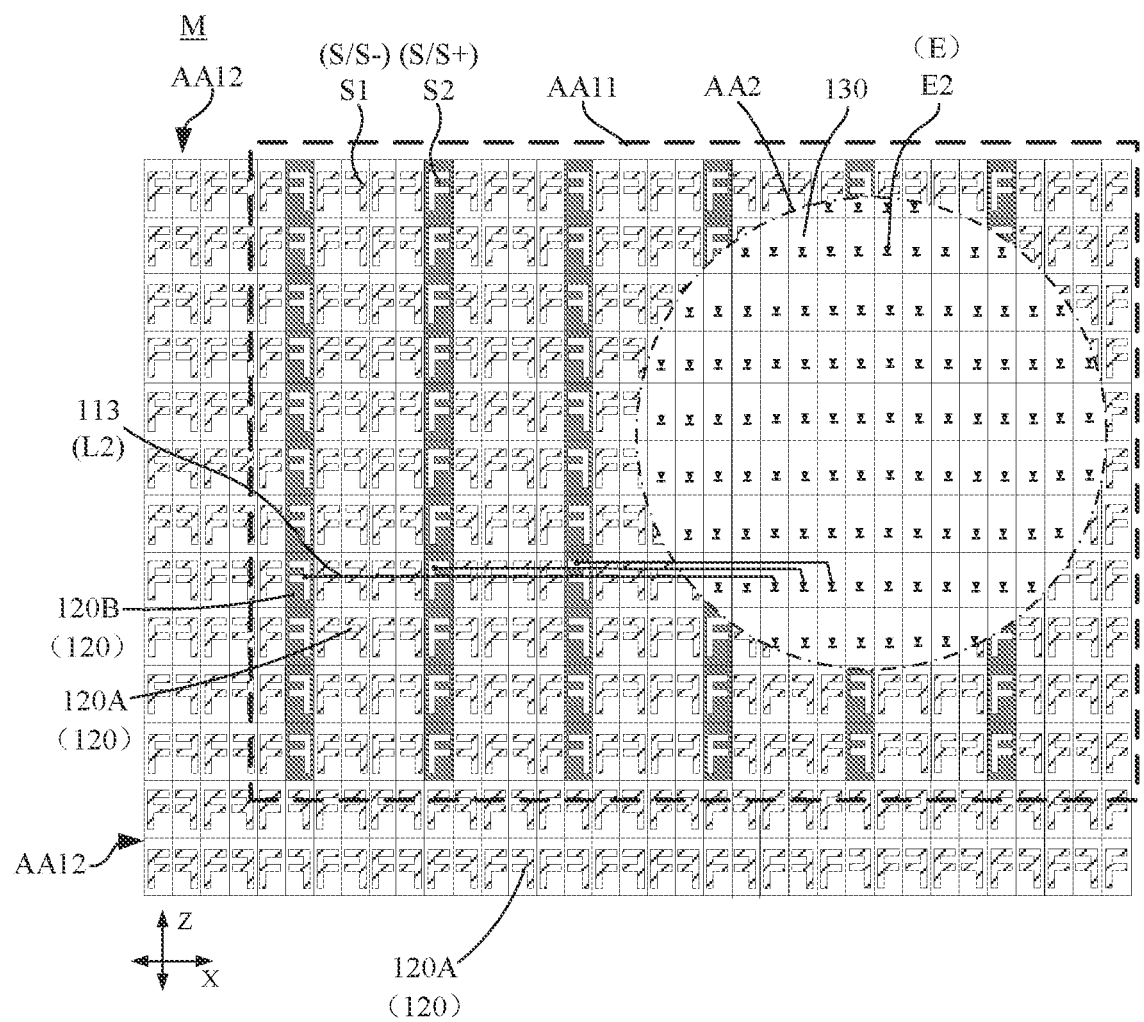
FIG. 3B is an enlarged view of a region M in FIG. 3A.

FIG. 3A is a position diagram of a light-transmissive display region, a transition region, and a remaining display region in the display substrate. FIG. 3B is an enlarged view of the region M in FIG. 3A, where a first light-emitting device is not presented in FIG. 3B.

In some embodiments, referring to FIGS. 3A and 3B, the main display region AA1 of the display substrate 100 may include the transition region AA11 and the remaining display region AA12. The transition region AA11 may at least partially surround the light-transmissive display region AA2, that is, the transition region AA11 is located on at least one side outside the light-transmissive display region AA2 (for example, the transition region AA11 is located on a side outside the light-transmissive display region AA2, that is, the transition region AA11 partially surrounds the light-transmissive display region AA2; for another example, the transition region AA11 is located around the outside of the light-transmissive display region AA2, that is, the transition region AA11 is located on both upper and lower sides and left and right sides of the light-transmissive display region AA2, so that the transition region AA11 completely surrounds the light-transmissive display region AA2). Similarly, the remaining display region AA12 may at least partially surround the transition region AA11, that is, the remaining display region AA12 is located on at least one side outside the transition region AA11. An area of the remaining display region AA12 may be larger than that of the transition region AA11.

As shown in FIG. 3B, the display region AA includes a plurality of display unit areas that are arranged in an array. Each display unit area includes a plurality of display sub-areas 130. Each display sub-area 130 includes a light-emitting device E. For example, a display sub-area 130 in the main display region AA1 includes a first light-emitting device E1, and a display sub-area 130 in the light-transmissive display region AA2 includes a second light-emitting device E2.

As an example, the plurality of display sub-areas 130 include a first display sub-area 130 configured to emit light of a first color, a second display sub-area 130 configured to emit light of a second color, and a third display sub-area 130 configured to emit light of a third color. The first color, the second color, and the third color may be three primary colors. For example, the first color is red, the second color is green, and the third color is blue. Accordingly, the plurality of display sub-areas 130 includes a red display sub-area 130, a green display sub-area 130, and a blue display sub-area 130. As another example, the plurality of display sub-areas 130 may further include a fourth display sub-area 130 for emitting white light. The plurality of display sub-areas 130 in the display unit area can cooperate to emit white light.

Figure 8A:
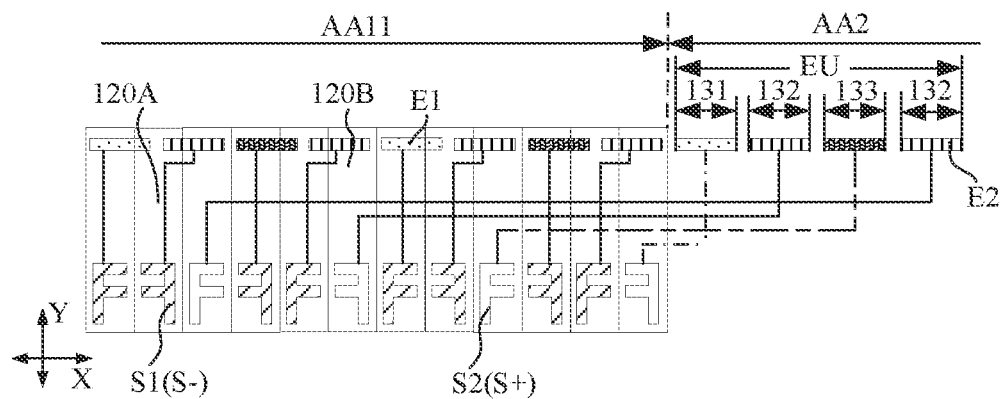
FIG. 8A is a connection equivalent diagram of a display substrate, in accordance with some embodiments.

In some examples, as shown in FIG. 8A, the display unit area EU includes four display sub-areas, which are arranged as the following rule: a display sub-area 131 of the first color, a display sub-area 132 of the second color, a display sub-area 133 of the third color, and a display sub-area 132 of the second color.

For example, the display sub-area 131 of the first color is the red display sub-area, the display sub-area 132 of the second color is the green display sub-area 130, and the display sub-area 133 of the third color is the blue display sub-area 130. The red display sub-area 130 includes a red light-emitting device E, the green display sub-area 130 includes a green light-emitting device E, and the blue display sub-area 130 includes a blue light-emitting device E. That is, the display unit area in this example includes one red light-emitting device E, one blue light-emitting device E and two green light-emitting devices E.

As shown in FIG. 3B, the main display region AA1 includes a plurality of pixel unit areas that are arranged in an array. Each pixel unit area includes a plurality of sub-pixel areas 120. Sub-pixel areas 120 in the transition region AA11 may include normal sub-pixel areas 120A and dummy sub-pixel areas 120B. Each sub-pixel area includes a pixel circuit S. In some examples, the number of the sub-pixel areas 120 in the pixel unit area may be equal to the number of the display sub-areas 130 in the display unit area, and a plurality of pixel circuits S in the pixel unit area may be coupled to a plurality of light-emitting devices E in the display unit area.

Figure 10C:
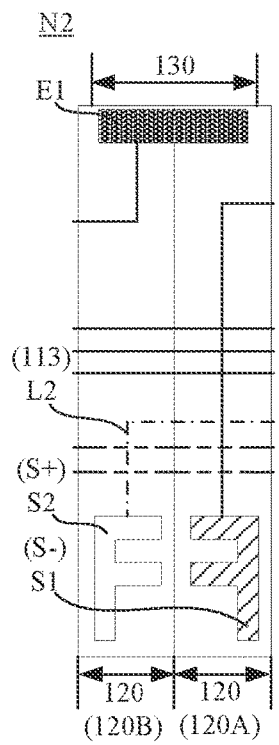
FIG. 10C is an enlarged view of a region N2 in FIG. 10B.
Figure 11A:
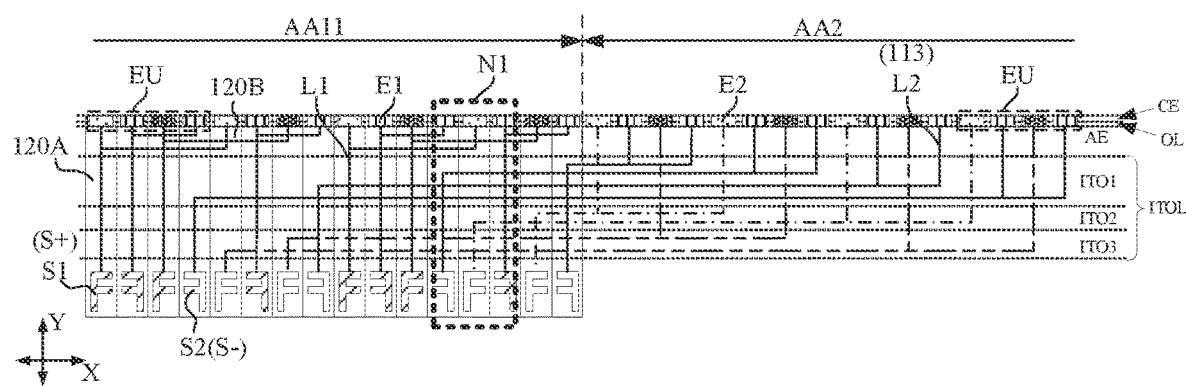
FIG. 11A is a connection equivalent diagram of yet another display substrate, in accordance with some embodiments.
Figure 11B:
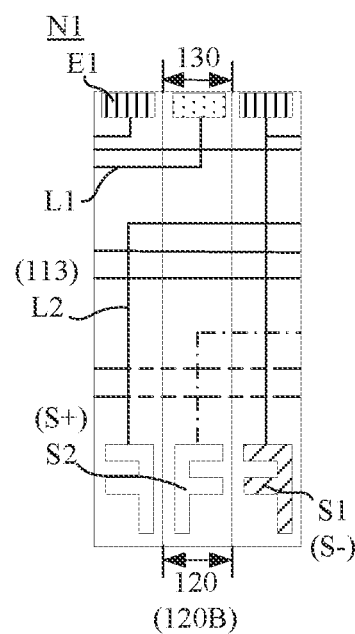
FIG. 11B is an enlarged view of a region N1 in FIG. 11A.

In some embodiments, as shown in FIG. 11B, in the main display region AA1, sub-pixel areas 120 and display sub-areas 130 may overlap or partially overlap. In some other embodiments, as shown in FIG. 10C, in the main display region AA1, a portion of the display sub-area 130 may at least partially overlap a sub-pixel area 120, and another portion of the display sub-area 130 may at least partially overlap another sub-pixel area 120.

Figure 4:
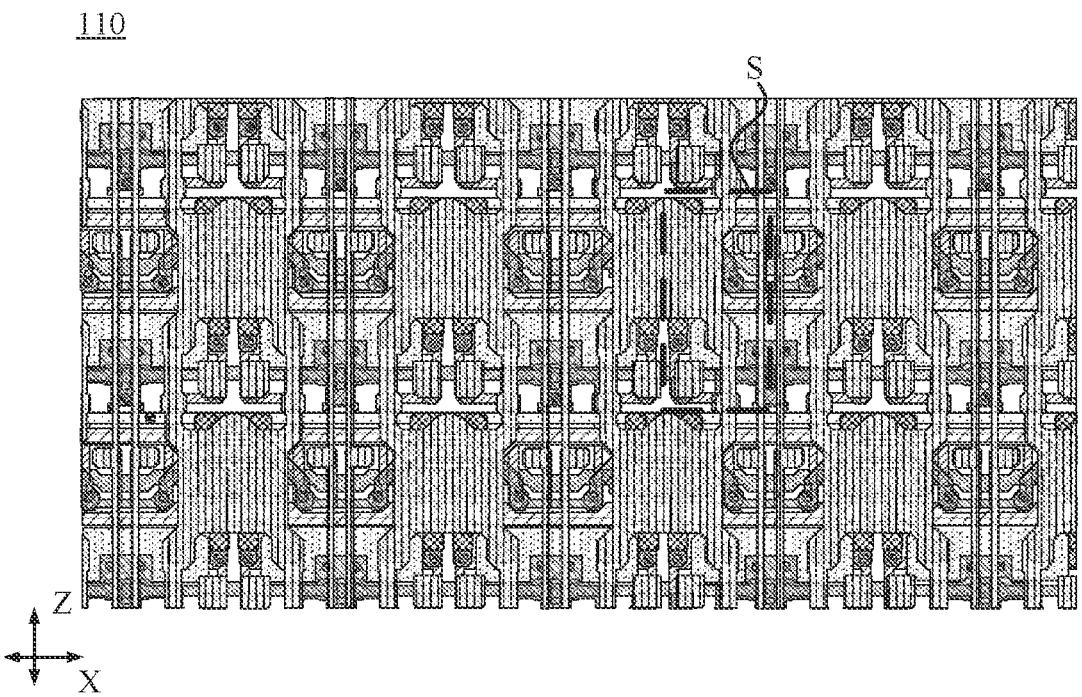
FIG. 4 is a structural diagram of yet another display substrate, in accordance with some embodiments.
Figure 5A:
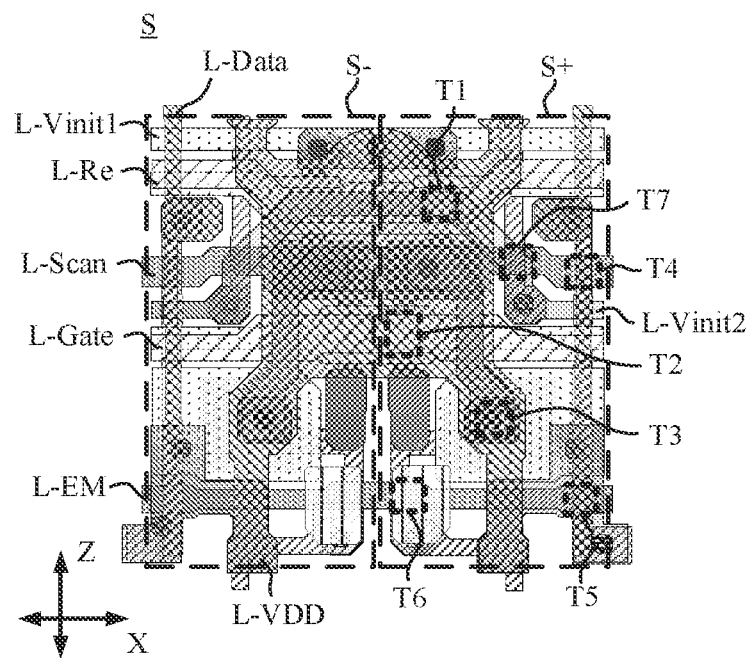
FIG. 5A is a structural diagram of two adjacent pixel circuits in a display substrate, in accordance with some embodiments.
Figure 6:
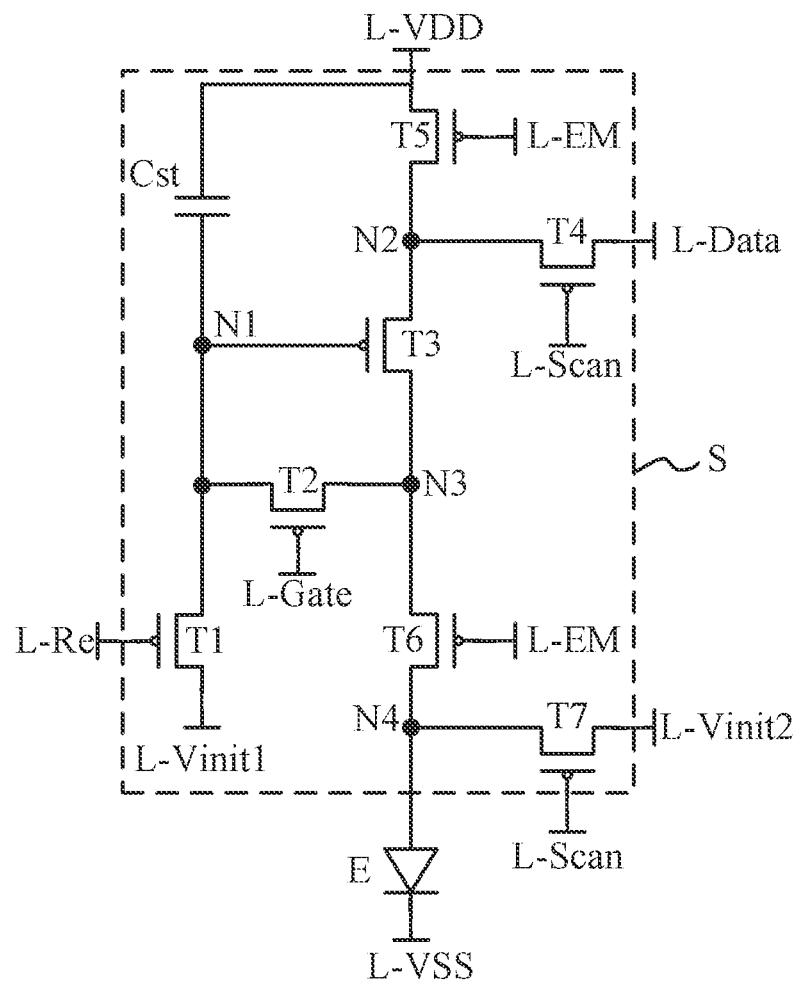
FIG. 6 is an equivalent circuit diagram of a pixel circuit and a light-emitting device in a display substrate, in accordance with some embodiments.

FIG. 4 shows a structural diagram of a plurality of pixel circuits in the display substrate. FIG. 5A shows a structural diagram of a pixel circuit of a first type of and a pixel circuit of a second type that are adjacent in the display substrate. FIG. 6 shows an equivalent circuit diagram of a pixel circuit and a light-emitting device.

Referring to FIGS. 3B and 4, in some embodiments, the normal sub-pixel area 120A may include first pixel circuits S1. The pixel circuit S is coupled to the light-emitting device E, and is configured to drive the light-emitting device E to emit light. In embodiments of the present disclosure, an area occupied by a pixel circuit S is referred to as a sub-pixel area.

For example, the light-emitting device E may be any of a light-emitting diode (LED), an organic light-emitting diode (OLED), a quantum dot light-emitting diode (QLED), a tiny LED (including a mini LED or a micro LED), and the like. The light-emitting device E (e.g., the OLED or the QLED) includes a cathode and an anode. The light-emitting device E is lit when a current is created between the anode and the cathode.

As shown in FIGS. 5A to 5H, and 6, in order to make the pixel circuits operate, the display substrate 100 further includes a plurality of signal lines. For example, the plurality of signal lines include data lines L-Data each configured to transmit a data signal, gate lines L-Gate each configured to transmit a first scan signal, scan lines L-Scan each configured to transmit a second scan signal, reset signal lines L-Re each configured to transmit a reset signal, light emission control signal lines L-EM each configured to transmit an enable signal, first initialization signal lines L-Vinit1 each configured to transmit a first initialization signal, second initialization signal lines L-Vinit2 each configured to transmit a second initialization signal, first power lines L-VDD each configured to transmit a first power voltage VDD (e.g., a high voltage), and second power lines L-VSS each configured to transmit a second power voltage VSS (e.g., a low voltage).

The structure of the pixel circuit S varies, which may be set according to actual needs. For example, the pixel circuit S may include at least two transistors (denoted by T) and at least one capacitor (denoted by C). For example, the pixel circuit S may have a "2T1C" structure, a "6T1C" structure, a "7T1C" structure, a "6T2C" structure, a "7T2C" structure, or the like.

As shown in FIGS. 5A to 5H, and 6, for example, the pixel circuit S having the "7T1C" structure includes, a first transistor T1, a second transistor T2, a third transistor T3, a fourth transistor T4, a fifth transistor T5, a sixth transistor T6, a seventh transistor T7, and a capacitor Cst. The pixel circuit S is coupled to a light-emitting device E.

A control electrode of the first transistor T1 is coupled to the reset signal line L-Re, a first electrode of the first transistor T1 is coupled to the first initialization signal line L-Vinit1, and a second electrode of the first transistor T1 is coupled to a first node N1.

A control electrode of the second transistor T2 is coupled to the gate line L-Gate, a first electrode of the second transistor T2 is coupled to a third node N3, and a second electrode of the second transistor T2 is coupled to the first node N1.

A control electrode of the third transistor T3 is coupled to the first node N1, a first electrode of the third transistor T3 is coupled to a second node N2, and a second electrode of the third transistor T3 is coupled to the third node N3.

A control electrode of the fourth transistor T4 is coupled to the scan line L-Scan, a first electrode of the fourth transistor T4 is coupled to the data line L-Data, and a second electrode of the fourth transistor T4 is coupled to the second node N2.

A control electrode of the fifth transistor T5 is coupled to the light emission control signal line L-EM, a first electrode of the fifth transistor T5 is coupled to the first power line L-VDD, and a second electrode of the fifth transistor T5 is coupled to the second node N2.

A control electrode of the sixth transistor T6 is coupled to the light emission control signal line L-EM, and a first electrode of the sixth transistor T6 is coupled to the third node N3, and a second electrode of the sixth transistor T6 is coupled to a fourth node N4.

A control electrode of the seventh transistor T7 is coupled to the scan line L-Scan, a first electrode of the seventh transistor T7 is coupled to the second initialization signal line L-Vinit2, and a second electrode of the seventh transistor T7 is coupled to the fourth node N4.

A first electrode plate of the capacitor Cst is coupled to the first power line L-VDD, and a second electrode plate of the capacitor Cst is coupled to the first node N1.

The anode of the light-emitting device E is coupled to the fourth node N4, and the cathode of the light-emitting device E is coupled to the second power line L-VSS.

In some embodiments, the fourth transistor T4 is configured to be turned on (i.e., create a conducive path between the second node N2 and the data line L-Data) in response to the scan signal being at an active level. The data signal is transmitted to the first node N1, and the capacitor Cst is charged. The third transistor T3 is configured to control a magnitude of a current flowing through the third transistor T3 in response to the level at the first node N1. Since the light-emitting device E is connected in series with a driving transistor (i.e., the third transistor T3), the luminance of the light-emitting device E varies with the magnitude of the current.

As shown in FIGS. 5A to 5H, in some embodiments, the display substrate includes a first semiconductor layer 210, a first conductive layer 220, a second conductive layer 230, a second semiconductor layer 240, a third conductive layer 250, a fourth conductive layer 260, and a fifth conductive layer 270 that are disposed in a direction away from the substrate.

The first semiconductor layer 210 may include a low temperature poly-silicon (LTPS) material or include other suitable materials, which is not limited herein.

The second semiconductor layer 240 may include a low temperature polycrystalline oxide (LTPO) material or include other suitable materials, which is not limited herein.

The first conductive layer 220, the second conductive layer 230, the third conductive layer 250, the fourth conductive layer 260 and the fifth conductive layer 270 may each include a metal material, an alloy material, or other conductive material. The metal material is, for example, aluminum Al, copper Cu, silver Ag, magnesium Mg, ytterbium Yb, lithium Li, or the like.

Figure 5B:
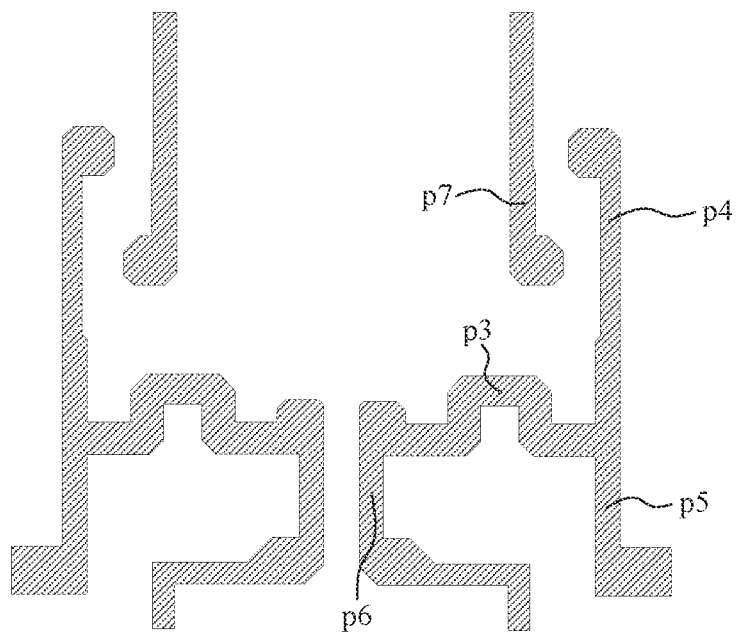
FIGS. 5B-5H are structural diagrams of film layers in FIG. 5A.

As shown in FIG. 5B, the first semiconductor layer 210 may include active layer of a plurality of transistors in the pixel circuit. Considering an example where the pixel circuit in FIG. 5A includes the first transistor T1 to the seventh transistor T7, the first semiconductor layer 210 may include active layers (p3 to p7) of the third transistor T3 to the seventh transistor T7.

In some examples, the active layer p7 of the seventh transistor T7 is a separate active layer. The active layer p3 of the third transistor T3 to the active layer p6 of the sixth transistor T6 are of a one-piece structure.

In some embodiments, a first insulating layer may further be provided between the first semiconductor layer 210 and the first conductive layer 220. The material of the first insulating layer may be any or a combination of oxides, nitrides or oxynitrides, which is not limited herein.

Figure 5C:
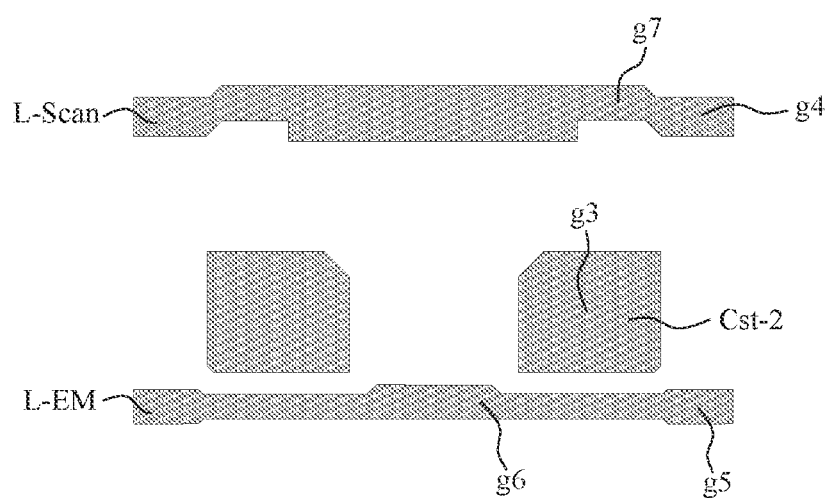

As shown in FIG. 5C, in some embodiments, the first conductive layer 220 may include the scan line L-Scan, the light emission control signal line L-EM, control electrodes g3-g7 of the third transistor T3 to the seventh transistor T7, and the second plate Cst-2 of the storage capacitor Cst.

In some examples, the scan line L-Scan, the control electrode g4 of the fourth transistor T4 and the control electrode g7 of the seventh transistor T7 may be of a one-piece structure.

In some examples, the light emission control signal line L-EM, the control electrode g5 of the fifth transistor T5 and the control electrode of the sixth transistor T6 may be of a one-piece structure.

In some examples, the second plate Cst-2 of the storage capacitor Cst and the control electrode g3 of the third transistor T3 may be of a one-piece structure.

In some embodiments, a second insulating layer may further be provided between the first conductive layer 220 and the second conductive layer 230. The material of the second insulating layer may be any or a combination of oxides, nitrides or oxynitrides, which is not limited herein.

Figure 5D:
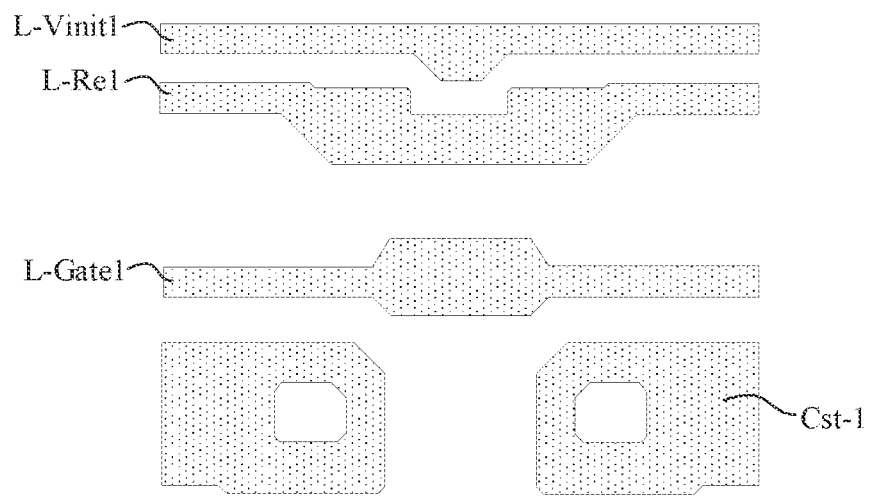

As shown in FIG. 5D, in some embodiments, the second conductive layer 230 may include the first initialization signal line L-Vinit1, a first reset signal line L-Re1, a first gate line L-Gate1, and the first plate Cst-1 of the storage capacitor Cst.

In some examples, the first initialization signal line L-Vinit1 and the first gate line L-Gate1 are located at both sides of the first reset signal line L-Re1.

In some embodiments, a third insulating layer may further be provided between the second conductive layer 230 and the second semiconductor layer 240. The material of the third insulating layer may be any or a combination of oxides, nitrides or oxynitrides, which is not limited herein.

Figure 5E:
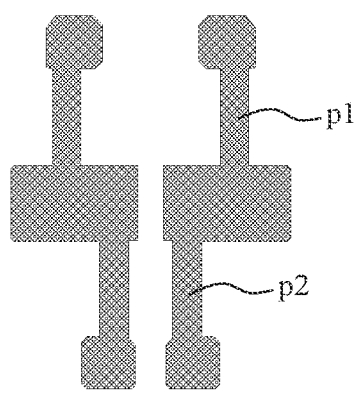

As shown in FIG. 5E, the second semiconductor layer 240 may include active layers of another plurality of transistors in the pixel circuit. Considering an example where the pixel circuit in FIG. 5A includes the first transistor T1 to the seventh transistor T7, the second semiconductor layer 240 may include active layers (p1 to p2) of the first transistor T1 and the second transistor T2.

In some examples, the active layer p1 of the first transistor T1 and the active layer p2 of the second transistor T2 are of a one-piece structure.

In some embodiments, a fourth insulating layer may be further provided between the second semiconductor layer 240 and the third conductive layer 250. The material of the fourth insulating layer may be any or a combination of oxides, nitrides or oxynitrides, which is not limited herein.

Figure 5F:
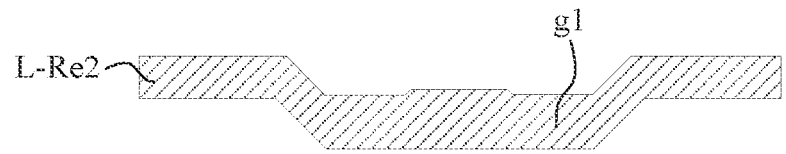

As shown in FIG. 5F, the third conductive layer 250 may include a second reset signal line L-Re2, a second gate line L-Gate2, the control electrode g1 of the first transistor T1, and the control electrode g2 of the second transistor T2.

In some examples, an orthogonal projection of the second reset signal line L-Re2 on the substrate and an orthogonal projection of the first reset signal line L-Re1 on the substrate overlap, so that the second reset signal line L-Re2 and the first reset signal line L-Re1 constitute the reset signal line L-Re together. Similarly, an orthographic projection of the second gate line L-Gate2 on the substrate and an orthographic projection of the first gate line L-Gate1 on the substrate overlap, so that the second gate line L-Gate2 and the first gate line L-Gate1 constitute the gate line L-Gate together.

In some examples, the second reset signal line L-Re2 and the control electrode g1 of the first transistor T1 may be of a one-piece structure.

In some examples, the second gate line L-Gate2 and the control electrode g2 of the second transistor T2 may be of a one-piece structure.

In some embodiments, a fifth insulating layer may further be provided between the third conductive layer 250 and the fourth conductive layer 260. The material of the fifth insulating layer may be any or a combination of oxides, nitrides or oxynitrides, which is not limited herein.

Figure 5G:
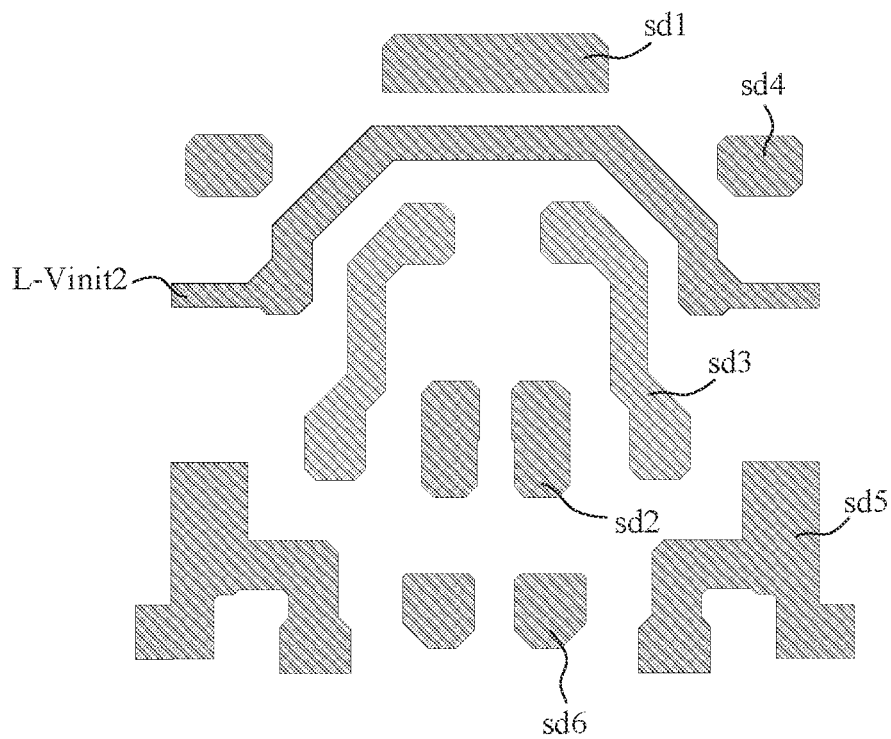

As shown in FIG. 5G, the fourth conductive layer 260 may include the second initialization signal line L-Vinit2 and some transition members sd1 to sd6.

In some examples, the first transition member sd1 may connect two portions of the second semiconductor layers 240 in two adjacent pixel circuits.

In some examples, the second transition member sd2 may connect the first semiconductor layer 210 and the second semiconductor layer 240 in a pixel circuit.

In some examples, the third transition member sd3 may connect the control electrode g3 of the third transistor T3 and the second electrode of the first transistor T1.

In some examples, the fourth transition member sd4 may connect the first electrode of the fourth transistor T4 and the data line L-Data.

In some examples, the fifth transition member sd5 may connect the first electrode of the fifth transistor T5 and the first power line L-VDD.

In some examples, the sixth transition member sd6 may connect the control electrode g6 of the sixth transistor T6 and the light emission control signal line L-EM.

In some examples, the transition members (sd1 to sd 6) may be provided independently one another.

In some embodiments, a sixth insulating layer may further be provided between the fourth conductive layer 260 and the fifth conductive layer 270. The material of the sixth insulating layer may be any or a combination of oxides, nitrides or oxynitrides, which is not limited herein.

Figure 5H:
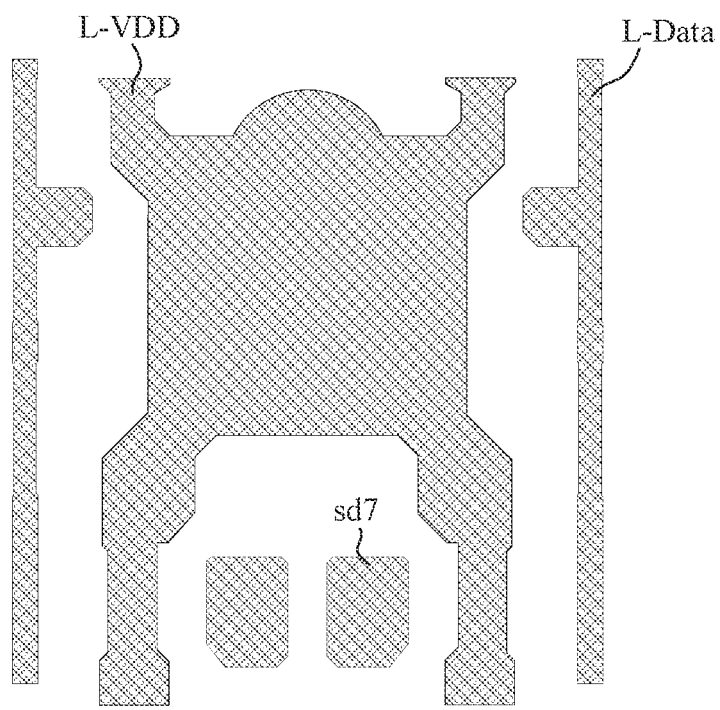

As shown in FIG. 5H, the fifth conductive layer 270 may include the first power line L-VDD, data lines L-Data, and a transition member sd7.

In some examples, an orthographic projection of the first power line L-VDD on the substrate covers two adjacent sub-pixel areas, and two data lines L-Data connected to pixel circuits in the two sub-pixel areas are located at both sides of the first power line L-VDD.

In some examples, the transition member sd7 connects the second electrode of the sixth transistor T6 and the anode of the light-emitting device E.

Referring to FIG. 3B, the normal sub-pixel area 120A of the display substrate 100 is provided with the first pixel circuit S1 therein. The first light-emitting device E1 coupled to the first pixel circuit S1 and the first pixel circuit S1 are both located in the transition region AA11. The dummy sub-pixel areas 120B of the display substrate 100 is provided with the second pixel circuit S2 therein. The second light-emitting device E2 coupled to the second pixel circuit S2 is located in the light-transmissive display region AA2.

As shown in FIG. 3B, in some embodiments, in a first direction X, at least one dummy sub-pixel area 120B is located between two normal sub-pixel areas 120A. It can be understood that, in the first direction X, at least one second pixel circuit S2 is located between two first pixel circuits S1.

As shown in FIG. 3B, in some embodiments, in the first direction X, at least one normal sub-pixel area 120A is located between two dummy sub-pixel areas 120B. It can be understood that, in the first direction X, at least one first pixel circuit S1 is located between two second pixel circuits S2.

As shown in FIG. 8A, in some examples, the arrangement of two pixel unit areas in the transition region AA11 may be as follows: a normal sub-pixel area 120A, a normal sub-pixel area 120A, a dummy sub-pixel area 120B, a normal sub-pixel area 120A, a normal sub-pixel area 120A, a dummy sub-pixel area 120B, a normal sub-pixel area 120A, a normal sub-pixel area 120A, a dummy sub-pixel area 120B, a normal sub-pixel area 120A, a normal sub-pixel area 120A, and a dummy sub-pixel area 120B.

Figure 8B:
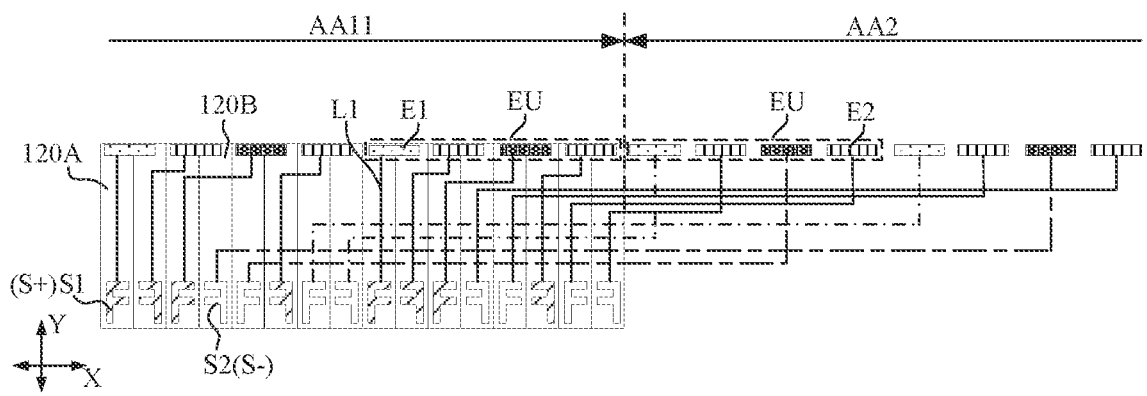
FIG. 8B is a connection equivalent diagram of another display substrate, in accordance with some embodiments.

As shown in FIG. 8B, in some examples, the arrangement of two pixel unit areas in the transition region AA11 may be as follows: a normal sub-pixel area 120A, a normal sub-pixel area 120A, a normal sub-pixel area 120A, a dummy sub-pixel area 120B, a dummy sub-pixel area 120B, a normal sub-pixel area 120A, a dummy sub-pixel area 120B and a dummy sub-pixel area 120B.

Figure 13:
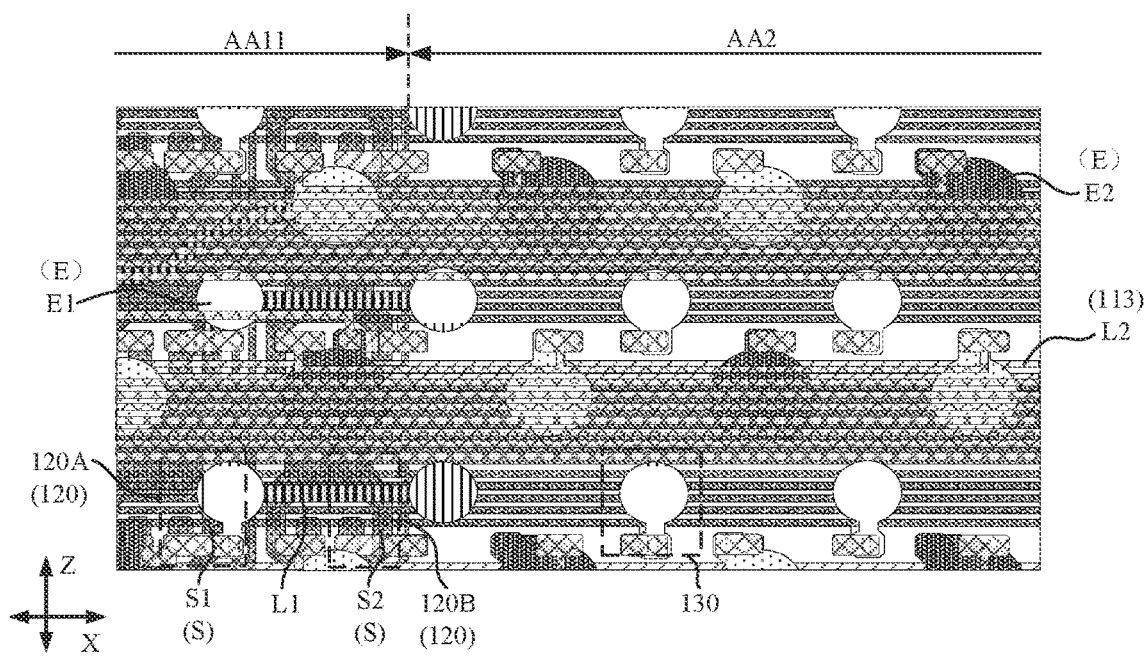
FIG. 13 is a partial structural diagram of another display substrate, in accordance with some embodiments.

With continued reference to FIG. 3B, the light-transmissive display region AA2 includes a plurality of second light-emitting devices E2 arranged in an array. The second light-emitting device E2 in the light-transmissive display region AA2 is coupled to the second pixel circuit S2 in the dummy sub-pixel area 120B in the transition region AA11, and is driven by the second pixel circuit S2 to emit light. The second pixel circuit S2 in the dummy sub-pixel area 120B in the transition region AA11 may be coupled to the second light-emitting device E2 in the light-transmissive display region AA2 through a conductive line 113 (e.g., a transparent conductive line). To improve the clarity of the accompanying drawing, only three conductive lines 113 are shown in FIG. 3B. In the present embodiment, the second pixel circuits S2 in the dummy sub-pixel area 120B in the transition region AA11 may be coupled to the second light-emitting devices E2 in the light-transmissive display region AA2 through the conductive lines 113. As shown in FIG. 13, since the light-transmissive display region AA2 is not provided with the pixel circuit S therein, the shielding of the pixel circuit S from light may be reduced, and thus the light transmittance of the light-transmissive display region AA2 may be improved.

With continued reference to FIGS. 3A and 3B, in some examples, the remaining display region AA12 includes a plurality of normal sub-pixel areas 120A arranged in an array. As shown in FIGS. 8A and 8B, a first light-emitting device E1 and a first pixel circuit S1 are located in a normal sub-pixel area 120A. The first pixel circuit S1 and the first light-emitting device E1 located in the same normal sub-pixel area 120A are coupled, so as to drive the first light-emitting device E1 in the remaining display region AA12 to emit light.

In other examples, the remaining display region AA12 includes both normal sub-pixel areas 120A and dummy sub-pixel areas 120B. Second pixel circuit S2 in the dummy sub-pixel area 120B in the remaining display region AA12 is not coupled to a light-emitting device E.

In some embodiments, a dimension of the first light-emitting device E1 in the first direction X may be greater than, less than or equal to a dimension of the second light-emitting device E2 in the first direction X. For example, all the light-emitting devices E in the display substrate are substantially equal in size. The dimension of the light-emitting device E in the first direction may refer to an average of dimensions of all portions of the light-emitting device E in the first direction.

In some embodiments, the dimension of the first pixel circuit S1 in the first direction X may be greater than, less than or equal to the dimension of the second pixel circuit S2 in the first direction X. For example, all the pixel circuits S in the display substrate are substantially equal in size. The dimension of the pixel circuit S in the first direction may refer to an average of dimensions of all portions of the pixel circuit S in the first direction.

In order to realize the coupling of the pixel circuit S and the light-emitting device E, some embodiments of the present disclosure provide a display substrate 100.

As shown in FIGS. 3B and 4, in the display region AA of the display substrate 100, a plurality of pixel circuits S arranged in an array include pixel circuits S+ of the first type and pixel circuits S− of the second type. For example, the first pixel circuits S1 include the pixel circuits S+ of the first type and the pixel circuits S− of the second type. For another example, the second pixel circuits S2 include the pixel circuits S+ of the first type and the pixel circuits S− of the second type.

In two adjacent pixel circuits S in the first direction X, one is the pixel circuit S+ of the first type, and the other is the pixel circuit S− of the second type. It can be understood that the pixel circuits S+ of the first type and the pixel circuits S− of the second type are alternately arranged in the first direction X.

The structure of the pixel circuit S+ of the first type and the structure of the pixel circuit S− of the second type may be different. For example, the structure of the pixel circuit S+ of the first type and the structure of the pixel circuit S− of the second type are mutually mirror image structures. For another example, the pixel circuit S+ of the first type has a 7T1C structure, and the pixel circuit S− of the second type has a 7T2C structure. For yet another example, the pixel circuit S+ of the first type and the pixel circuit S− of the second type each have a 7T1C structure, but have different structural morphology.

It will be noted that the above cases that the structure of the pixel circuit S+ of the first type is different from the structure of the pixel circuit S− of the second type are only examples, and are not to be considered as limitations on the structures of the pixel circuit S+ of the first type and the pixel circuit S− of the second type being different. It can be understood that, in a case where the same data signal is input, two pixel circuits outputting different anode voltages may be considered as the pixel circuit S+ of the first type and the pixel circuit S− of the second type.

For example, the structure of the pixel circuit S+ of the first type and the structure of the pixel circuit S− of the second type are mutually mirror image structures.

For example, the first pixel circuit S1 and the second pixel circuit S2 that are adjacent in the transition region AA11 are arranged in a mirror image manner. For another example, two adjacent second pixel circuits S2 in the transition region AA11 are arranged in a mutual mirror image manner. For yet another example, two adjacent first pixel circuits S1 in the main display region AA1 are arranged in a mutual mirror image manner.

The two pixel circuits S arranged in in a mutual mirror image manner include a pixel circuit S with a first mirror image side and a pixel circuit S with a second mirror image side. For example, two pixel circuits S that are mutually mirror image left and right in the first direction X include the pixel circuit S with the left mirror image side (i.e., the first mirror image side) and the pixel circuit S with the right mirror image side (i.e., the second mirror image side). As shown in FIG. 3B, the second light-emitting devices E2 in the light-transmissive display region AA2 include second light-emitting devices E2 of a plurality of colors. The second pixel circuits S2 in the transition region AA11 include second pixel circuits S2 with the first mirror image side and second pixel circuits S2 with the second mirror image side. Therefore, in some embodiments, the second light-emitting devices E2 being coupled to the second pixel circuits S2 in the transition region AA11 includes the case where the second light-emitting devices E2 of the same color are coupled to the second pixel circuits S2 with the first mirror image side and the second pixel circuits S2 with the second mirror image side.

However, it is found through research by inventors of the present disclosure that, due to the difference in structure between the pixel circuit S+ of the first type and the pixel circuit S− of the second type, characteristics of transistors in the pixel circuit S+ of the first type in the second pixel circuits are different from characteristics of transistors in the pixel circuit S− of the second type in the second pixel circuits, and thus the anode voltage provided by the pixel circuit S+ of the first type in the second pixel circuits is different from the anode voltage provided by the pixel circuit S− of the second type in the second pixel circuits.

Figure 7:
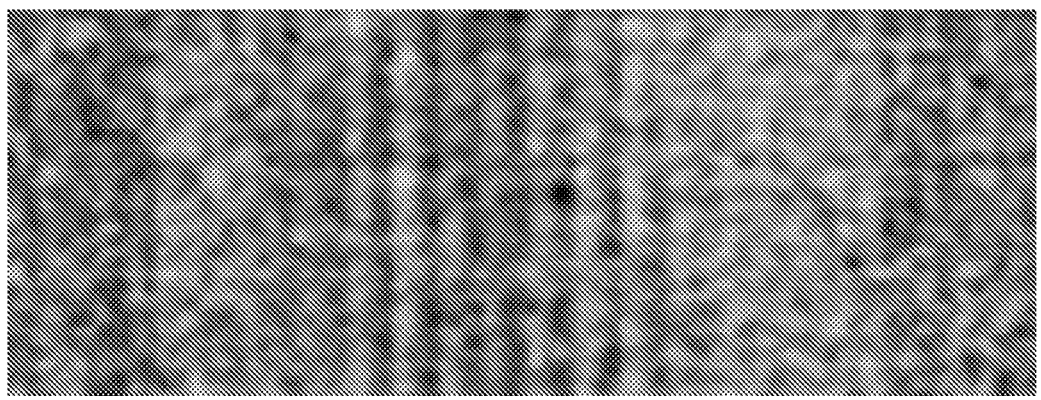
FIG. 7 is a display effect diagram of a display apparatus, in accordance with some embodiments.

Two second light-emitting devices of the same color and arranged in succession should have relatively similar brightness due to their relatively close positions. In a case where the two second light-emitting devices E2 with the same color and arranged in succession in the light-transmissive display region AA2 are coupled to the pixel circuit S+ of the first type in the second pixel circuits S2 and the pixel circuit S− of the second type in the second pixel circuits S2, it may cause the problem that the two second light-emitting devices E2 with the same color and arranged in succession have a relatively significant difference in luminous brightness, so that the luminous uniformity of the light-transmissive display region AA2 is low (for example, as shown in FIG. 7, display fringes with alternating bright and dark appear), thereby causing the poor display effect of the display apparatus.

As shown in FIG. 8A, in some embodiments, a third sub-pixel area from left to right in the transition region AA11 is a dummy sub-pixel area 120B, and a second pixel circuit S2 in the dummy sub-pixel area 120B is the pixel circuit S+ of the first type and is coupled to a second light-emitting device E2 of the second color (e.g., green). A sixth sub-pixel area from left to right in the transition region AA11 is a dummy sub-pixel area 120B, and a second pixel circuit S2 in the dummy sub-pixel area 120B is the pixel circuit S− of the second type and is coupled to another second light-emitting device E2 of the second color (e.g., green). A ninth sub-pixel area from left to right in the transition region AA11 is a dummy sub-pixel area 120B, and a second pixel circuit S2 in the dummy sub-pixel area 120B is the pixel circuit S+ of the first type and is coupled to another second light-emitting device E2 of the third color (e.g., blue). A twelfth sub-pixel area from left to right in the transition region AA11 is a dummy sub-pixel area 120B, and a second pixel circuit S2 in the dummy sub-pixel area 120B is the pixel circuit S− of the second type and is coupled to another second light-emitting device E2 of the first color (e.g., red).

However, two second light-emitting devices E2 of the same color in the same display unit area are coupled to the pixel circuit S+ of the first type and the pixel circuit S− of the second type, which results in a significant difference in brightness between the two second light-emitting devices E2 of the same color in the display unit area. As a result, the luminous uniformity of the light-transmissive display region AA2 may be relatively low, and display fringes with alternating bright and dark shown in FIG. 7 appear, thereby causing the poor display effect of the display apparatus.

Figure 9:
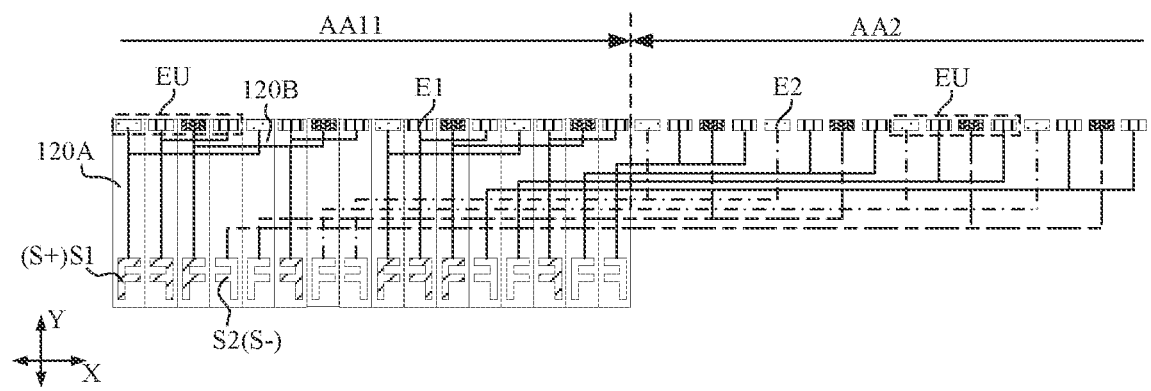
FIG. 9 is a connection equivalent diagram of yet another display substrate, in accordance with some embodiments.

As shown in FIGS. 8B and 9, in some embodiments, a fourth sub-pixel area and a fifth sub-pixel area from left to right in the transition region AA11 are both dummy sub-pixel areas 120B, and the two adjacent dummy sub-pixel areas 120B are coupled to two second light-emitting devices E2 of the third color (e.g., blue) in two adjacent display unit areas. A seventh sub-pixel area and an eighth sub-pixel area from left to right in the transition region AA11 are both dummy sub-pixel areas 120B, and the two adjacent dummy sub-pixel areas 120B are coupled to two second light-emitting devices E2 of the first color (e.g., red) in the two adjacent display unit areas. A twelfth sub-pixel area, a thirteenth sub-pixel area, a fifteenth sub-pixel area and a sixteenth sub-pixel area from left to right in the transition region AA11 are all dummy sub-pixel areas 120B, and the four dummy sub-pixel areas 120B arranged in succession are coupled to four second light-emitting devices E2 of the second color (e.g., green) in the two adjacent display unit areas.

However, two light-emitting devices E of the same color in the two adjacent display unit areas are coupled to the pixel circuit S+ of the first type and the pixel circuit S− of the second type, which results in a significant difference in brightness between the two light-emitting devices E of the same color in the two adjacent display unit areas. As a result, the luminous uniformity of the light-transmissive display region AA2 may be relatively low, and display fringes with alternating bright and dark shown in FIG. 7 appear, thereby causing the poor display effect of the display apparatus.

In light of this, some embodiments of the present disclosure provide a display substrate and a display apparatus.

Figure 10A:
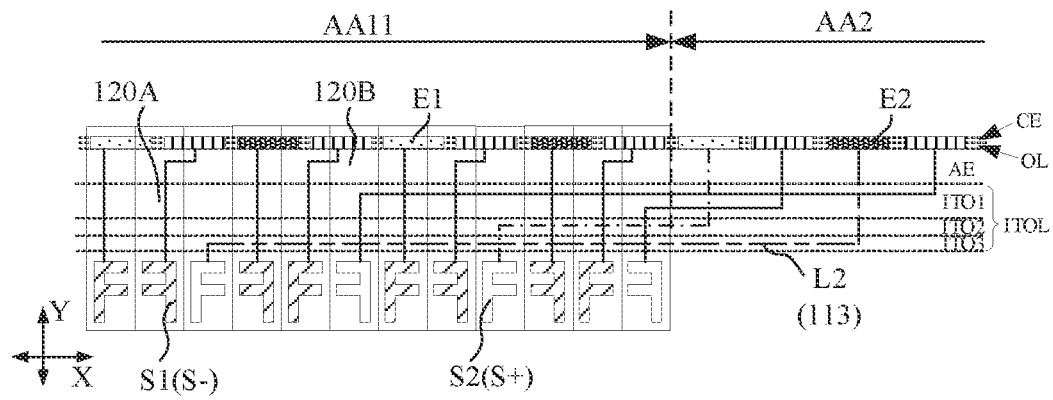
FIG. 10A is a connection equivalent diagram of yet another display substrate, in accordance with some embodiments.
Figure 10B:
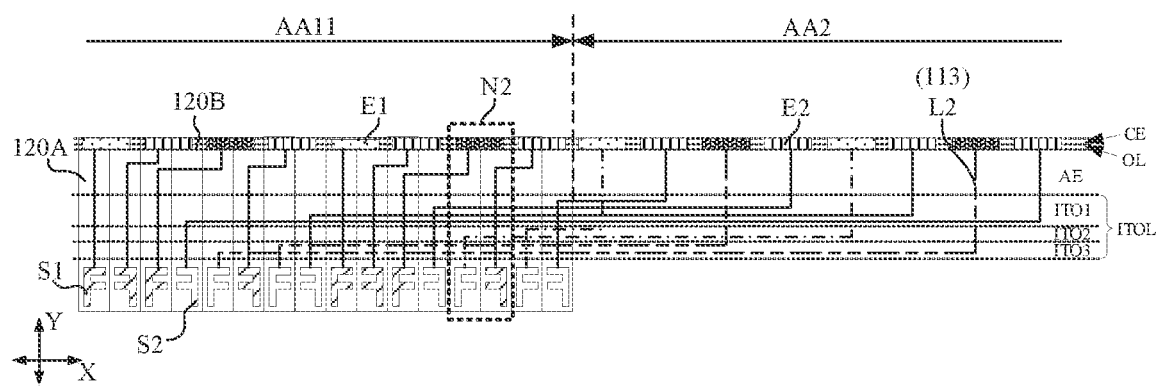
FIG. 10B is a connection equivalent diagram of yet another display substrate, in accordance with some embodiments.

FIG. 10A is a connection equivalent diagram of coupling between a second pixel circuit and a second light-emitting device in the display substrate according to some embodiments. FIG. 10B is a connection equivalent diagram of coupling between a second pixel circuit and a second light-emitting device in the display substrate according to some embodiments. FIG. 10C is an enlarged view of a region N2 in FIG. 10B. FIG. 11A is a connection equivalent diagram of coupling between a second pixel circuit and a second light-emitting device in the display substrate according to some embodiments. FIG. 11B is an enlarged view of a region N1 in FIG. 11A.

In some embodiments, in the first direction X, at least two second light-emitting devices E2 of the same color and arranged in succession are all coupled to the pixel circuits S+ of the first type or all coupled to the pixel circuits S− of the second type. In this way, the at least two second light-emitting devices E2, of the same color and arranged in succession, in the light-transmissive display region AA2 may obtain anode voltages generated by transistors with the same characteristics (hereinafter referred to as the same anode voltages). Therefore, only the slight brightness difference caused by the difference of the data signals exists, while the brightness difference caused by the difference between structures of the pixel circuits does not exist, so that light with the same color and the same or similar brightness may be emitted.

The two second light-emitting devices E2 of the same color and arranged in succession as described above mean that there is no second light-emitting device E2 of the same color as that of the two second light-emitting devices of the same color between the two second light-emitting devices E2 of the same color in the first direction X. It will be noted that there may be second light-emitting device(s) E2 of other color(s) between the two second light-emitting devices E2 of the same color.

For example, in a case where there is no blue second light-emitting device E2 between two blue second light-emitting devices E2 in the first direction X, the two blue second light-emitting devices E2 are the two second light-emitting devices E2 of the same color and arranged in succession regardless of whether there is red second light-emitting device(s) E2 and/or green second light-emitting device(s) E2 between the two blue second light-emitting devices E2.

For example, in the first direction X, a first red second light-emitting device E2, a first green second light-emitting device E2, a first blue second light-emitting device E2, a second red second light-emitting device E2, a second green second light-emitting device E2, a second blue second light-emitting device E2, a third red second light-emitting device E2, a third green second light-emitting device E2, and a third blue second light-emitting device E2 are arranged in sequence. The first blue second light-emitting device E2 and the second blue second light-emitting device E2 are two second light-emitting devices E2 of the same color and arranged in succession. Since the second red second light-emitting device E2 is provided between the first red second light-emitting device E2 and the third red second light-emitting device E2, the first red second light-emitting device E2 and the third red second light-emitting device E2 are not the two second light-emitting devices E2 of the same color and are arranged in succession. Since there is no another green second light-emitting device E2 between the first green second light-emitting device E2 and the second green second light-emitting device E2, and there is no another green second light-emitting device E2 between the second green second light-emitting device E2 and the third green second light-emitting device E2, the first green second light-emitting device E2, the second green second light-emitting device E2 and the third green second light-emitting device E2 are three second light-emitting devices E2 of the same color and arranged in succession.

The at least two second light-emitting devices E2 of the same color and arranged in succession emit light with the similar brightness, so that human eyes cannot easily view the brightness difference between the at least two second light-emitting devices E2 arranged in succession, and thus the problem of low luminous uniformity of the display apparatus may be improved, thereby improving the display effect of the display apparatus.

In some examples, each display unit area in the light-transmissive display region AA2 includes a second light-emitting device of the first color, a second light-emitting device of the second color, and a second light-emitting device of the third color. Alternatively, each display unit area includes a second light-emitting device of the first color, a second light-emitting device of the second color, a second light-emitting device of the third color, and a second light-emitting device of the fourth color. For example, the fourth color is white. In the light-transmissive display region AA2, N (N is greater than or equal to 2 (N≥2) and is an integer) second light-emitting devices E2 of the same color and arranged in succession are coupled to N second pixel circuits S2 of the same type. For example, N second light-emitting devices E2 of the first color are coupled to pixel circuits S+ of the first type in the N second pixel circuits, respectively. For another example, N second light-emitting devices E2 of the first color are coupled to pixel circuits S– of the second type in the N second pixel circuits, respectively.

As shown in FIG. 11A, in some examples, each display unit area in the light-transmissive display region AA2 includes one light-emitting device of the first color, two light-emitting devices of the second color, and one light-emitting device of the third color. For example, N second light-emitting devices E2 of the first color and arranged in succession are respectively coupled to N pixel circuits S+ of the first type in the second pixel circuits S2, N second light-emitting devices E2 of the third color and arranged in succession are respectively coupled to N pixel circuits S+ of the first type in the second pixel circuit S2, and 2N second light-emitting devices E2 of the second color and arranged in succession are respectively coupled to 2N pixel circuits S– of the second type in the second pixel circuit S2.

For example, each display unit area in the light-transmissive display region AA2 includes one red light-emitting device, two green light-emitting devices, and one blue light-emitting device. In the light-transmissive display region AA2, N red second light-emitting devices E2 arranged in succession are respectively coupled to N pixel circuits S+ of the first type in the second pixel circuits S2, N blue second light-emitting devices E2 arranged in succession are respectively coupled to N pixel circuits S+ of the first type in the second pixel circuits S2, and 2N green second light-emitting devices E2 arranged in succession are respectively coupled to 2N pixel circuits S– of the second type in the second pixel circuits S2.

In some embodiments, second light-emitting devices E2 of the same color are each coupled to a pixel circuit S+ of the first type in the second pixel circuits S2; alternatively, the second light-emitting devices E2 of the same color are each coupled to a pixel circuits S– of the second type in the second pixel circuits S2.

In some examples, the red second light-emitting devices E2 in the light-transmissive display region AA2 are each coupled to a pixel circuit S+ of the first type in the second pixel circuits S2, the blue second light-emitting devices E2 in the light-transmissive display region AA2 are each coupled to a pixel circuit S+ of the first type in the second pixel circuits S2, and the green second light-emitting devices E2 in the light-transmissive display region AA2 are each coupled to a pixel circuits S– of the second type in the second pixel circuits S2.

In this way, the second light-emitting devices E2 of the same color can have the same anode voltages. That is, the second light-emitting devices E2 of the same color in the light-transmissive display region AA2 only have the brightness difference caused by the difference of the data signals, and does not have the brightness difference caused by the difference between the structures of the pixel circuits, so that the display effect of the display apparatus may be improved.

It has been explained above that, in the plurality of pixel circuits S arranged in the array, one of the two adjacent pixel circuits S in the first direction X is the pixel circuit S+ of the first type, and the other thereof is the pixel circuit S− of the second type; and the light-emitting devices E of the same color are coupled to the pixel circuits S of the same type. It can be understood that the pixel circuit S+ of the first type and the pixel circuit S− of the second type in the two adjacent second pixel circuits S2 in the first direction X are coupled to the second light-emitting devices E2 of different colors.

In some embodiments, light-emitting devices E of the same color are each coupled to a pixel circuit S+ of the first type in the second pixel circuits S2; alternatively, the light-emitting devices E of the same color are each coupled to a pixel circuits S− of the second type in the second pixel circuits S2. In other words, the first light-emitting device E1 and the second light-emitting device E2 have the same color, and are respectively coupled to the pixel circuit S+ of the first type in the first pixel circuits S1 and the pixel circuit S+ of the first type in the second pixel circuits S2; alternatively, the first light-emitting device E1 and the second light-emitting device E2 have the same color, and are respectively coupled to the pixel circuit S− of the second type in the first pixel circuits S1 and the pixel circuit S− of the second type in the second pixel circuits S2.

It can be understood that the second light-emitting devices E2 of a color in the light-transmissive display region AA2 may each be coupled to the pixel circuit S+ of the first type in the second pixel circuits S2, and the first light-emitting devices E1 of this color in the main display region AA1 may each be coupled to the pixel circuit S+ of the first type in the first pixel circuits S1. Alternatively, the second light-emitting devices E2 of a color in the light-transmissive display region AA2 may each be coupled to the pixel circuit S− of the second type in the second pixel circuits S2, and the first light-emitting devices E1 of this color in the main display region AA1 may each be coupled to the pixel circuit S− of the second type in the first pixel circuits S1.

In some examples, the blue second light-emitting devices E2 in the light-transmissive display region AA2 are each coupled to the pixel circuit S+ of the first type in the second pixel circuits S2, and the blue first light-emitting devices E1 in the main display region AA1 are each coupled to the pixel circuit S+ of the first type in the first pixel circuits S1. Similarly, the red second light-emitting devices E2 in the light-transmissive display region AA2 are each coupled to the pixel circuit S+ of the first type in the second pixel circuits S2, and the red first light-emitting devices E1 in the main display region AA1 are each coupled to the pixel circuit S+ of the first type in the first pixel circuits S1. Similarly, the green second light-emitting devices E2 in the light-transmissive display region AA2 are each coupled to the pixel circuit S− of the second type in the second pixel circuits S2, and the green first light-emitting devices E1 in the main display region AA1 are each coupled to the pixel circuit S− of the second type in the first pixel circuits S1.

In this way, the light-emitting devices E of the same color can have the same anode voltages. That is, the light-emitting devices E of the same color in the whole display region AA only have the brightness difference caused by the difference of the data signals, and does not have the brightness difference caused by the difference between the structures of the pixel circuits, so that the display effect of the display apparatus may be improved.

It has been explained above that, in the plurality of pixel circuits S arranged in the array, one of the two adjacent pixel circuits S in the first direction X is the pixel circuit S+ of the first type, and the other thereof is the pixel circuit S− of the second type; and the light-emitting devices E of the same color are coupled to the pixel circuits S of the same type. It can be understood that the pixel circuit S+ of the first type and the pixel circuit S− of the second type in the two adjacent pixel circuits S in the first direction X are coupled to light-emitting devices E of different colors.

In some embodiments, at least one second pixel circuit S2 is coupled to at least one second light-emitting device E2.

As shown in FIG. 10A, in some embodiments, a single second pixel circuit S2 is coupled to a single second light-emitting device E2. It can be understood that in the present embodiment, each second pixel circuit S2 is configured to drive a second light-emitting device E2 to emit light, and different second pixel circuits S2 are respectively configured to drive different second light-emitting devices E2 to emit light.

In FIG. 10A, a third sub-pixel area 120 from left to right in the transition region AA11 is a dummy sub-pixel area 120B, and a second pixel circuit S2 in the dummy sub-pixel area 120B is coupled to a second second light-emitting device E2 from right to left in the light-transmissive display region AA2 and not coupled to other second light-emitting devices E2 any more. Similarly, the other second pixel circuits S2 in FIG. 10A are each coupled to only one second light-emitting device E2, and details are not repeated here.

In some examples, in the transition region AA11, the number of the first pixel circuits S1 is equal to the number of the first light-emitting devices E1. For example, a plurality of first pixel circuits S1 may be coupled to a plurality of first light-emitting devices E1 in one-to-one correspondence.

As shown in FIGS. 10A and 10B, a plurality of light-emitting devices E are arranged in a row in the first direction X, and pixel circuits S with the number not less than the number of light-emitting devices E in the row are also arranged in a row. Since the pixel circuits S are not located in the light-transmissive display region AA2, the arrangement space of the pixel circuits S in the first direction X is smaller than that of the light-emitting devices E in the first direction X.

Therefore, in some embodiments, the dimension of the second pixel circuit S2 in the first direction X is smaller than the dimension of the light-emitting device E in the first direction X. In this way, the pixel circuits S with the number not less than the number of the light-emitting devices E may be arranged in a relatively small arrangement space.

In some embodiments, a single second pixel circuit S2 may be coupled to at least two second light-emitting devices E2. For example, each second pixel circuit S2 may be coupled to second light-emitting devices E2 respectively through a plurality of transparent conductive lines 113.

It can be understood that in the present embodiment, each second pixel circuit S2 is configured to drive at least two second light-emitting devices E2 to emit light, and different second pixel circuits S2 are configured to drive different second light-emitting devices E2 to emit light.

As shown in FIG. 11A, the single second pixel circuit S2 may be coupled to two second light-emitting devices E2. In FIG. 11A, a fourth sub-pixel area 120 from left to right in the transition region AA11 is a dummy sub-pixel area 120B, and a second pixel circuit S2 in the dummy sub-pixel area 120B is coupled to both a first second light-emitting device E2 and a third second light-emitting device E2 from right to left in the light-transmissive display region AA2 and not coupled to other second light-emitting devices E2 any more. Similarly, the other second pixel circuits S2 in FIG. 11A are each coupled to only two second light-emitting devices E2, and details are not repeated here.

As shown in FIG. 11A, in some embodiments, the number of the second pixel circuits S2 is less than the number of the second light-emitting devices E2. In this case, the single second pixel circuit S2 may be coupled to at least two second light-emitting devices E2 of the same color.

In some examples, the number of the second light-emitting devices E2 driven by each of the plurality of second pixel circuits S2 may be the same. In other examples, the number of the second light-emitting devices E2 driven by different second pixel circuits S2 may be different. There is no limitation herein.

In some examples, the number of the second light-emitting devices E2 may be equal to an integer multiple of the number of the second pixel circuits S2. For example, the light-transmissive display region AA2 is provided with 600 second light-emitting devices E2 therein, the transition region AA11 is provided with 300 second pixel circuits S2 therein, and each second pixel circuit S2 drives two second light-emitting devices E2 to emit light.

In some examples, in the transition region AA11, the number of the first pixel circuits S1 may also be less than the number of the first light-emitting devices E1. In this case, since the number of the second pixel circuits S2 is less than the number of the second light-emitting devices E2, in the transition region AA11 and the light-transmissive display region AA2, the total number of the pixel circuits S may be less than the total number of the light-emitting devices E.

In some embodiments, at least two second pixel circuits S2 may be coupled to a single second light-emitting device E2. For example, each second light-emitting device E2 may be coupled to second pixel circuits S2 respectively through a plurality of transparent conductive lines 113.

It can be understood that in the present embodiment, each second light-emitting device E2 is configured to emit light driven by at least two second pixel circuits S2. The second light-emitting device E2 is driven to emit light by the at least two pixel circuits S2 jointly.

It will be noted that in some examples, the plurality of second pixel circuits S2 are located at a side of the light-transmissive display region AA2 in the first direction X, and the second light-emitting devices E2 in the light-transmissive display region AA2 are coupled to the plurality of second pixel circuits S2 at the side of the light-transmissive display region AA2. In other examples, the plurality of second pixel circuits S2 are located at two sides of the light-transmissive display region AA2 in the first direction X, and the second light-emitting devices E2 in the light-transmissive display region AA2 are coupled to the plurality of second pixel circuits S2 at the two sides of the light-transmissive display region AA2. For example, the light-transmissive display region AA2 is divided into a first region and a second region in the first direction X. Second light-emitting devices E2 in the first region are coupled to second pixel circuits S2 at one side, and second light-emitting devices E2 in the second region are coupled to second pixel circuits S2 at the other side. The area of the first region and the area of the second region may be equal or different, and are not limited herein.

As shown in FIGS. 11A and 11B, in some embodiments, the dimension of a second pixel circuit S2 in the first direction X may be greater than, less than or equal to the dimension of a light-emitting device E in the first direction X. For example, the dimension of the second pixel circuit S2 in the first direction X may be equal to the dimension of the light-emitting device E in the first direction X. In this way, the first light-emitting device E1 and the first pixel circuit S1 may be located in a normal sub-pixel area 120A; alternatively, the first light-emitting device E1 and the second pixel circuit S2 are located in a dummy sub-pixel area 120B.

As shown in FIG. 11A, in some embodiments, in the light-transmissive display region AA2, two second light-emitting devices E2 belonging to two adjacent display unit areas and of the same color are coupled to the same second pixel circuit S2.

It can be understood that the second pixel circuit S2 may be configured to drive a plurality of second light-emitting devices E2 of the same color in a plurality of adjacent display unit areas to emit light.

In some examples, two red second light-emitting devices E2 in the two adjacent display unit areas are coupled to the same second pixel circuit S2.

The two second light-emitting devices E2 driven by the same second pixel circuit S2 may have the same luminous brightness, and the brightness difference between two adjacent display unit areas may be small. In this embodiment, the two second light-emitting devices E2 driven by the same second pixel circuit S2 are disposed in two adjacent display unit areas. In this way, on a basis of one second pixel circuit S2 driving the plurality of second light-emitting devices E2, the influence of the same brightness on the display screen may be reduced as much as possible. That is, it may not only improve the convenience of controlling the second light-emitting devices E2, but also ensure the display effect of the display apparatus.

As shown in FIG. 11A, in some embodiments, the light-transmissive display region AA2 of the display substrate includes a plurality of display unit areas, and each display unit area includes two second light-emitting devices E2 of the same color.

The two second light-emitting devices E2 of the same color in a display unit area are coupled to the same second pixel circuit S2.

It can be understood that the second pixel circuit S2 is configured to drive a plurality of second light-emitting devices E2 of the same color in the display unit area to emit light.

In some examples, as shown in FIG. 11A, the display unit area includes one red second light-emitting device E2, one blue second light-emitting device E2, and two green second light-emitting devices E2. The two green second light-emitting devices E2 in the display unit area are coupled to the same second pixel circuit S2.

The two second light-emitting devices E2 driven by the same second pixel circuit S2 may have the same luminous brightness, and the two light-emitting devices of the same color in the display unit area have the same brightness. In this embodiment, the two second light-emitting devices E2 of the same color in the display unit area are driven by the same second pixel circuit S2. In this way, on a basis of one second pixel circuit S2 driving the plurality of second light-emitting devices E2, the display screen may not be affected. That is, it may not only improve the convenience of controlling the second light-emitting devices E2, but also ensure the display effect of the display apparatus.

As shown in FIG. 10A, in some embodiments, in the first direction X, one dummy sub-pixel area 120B (the third sub-pixel area from left to right) is located between two normal sub-pixel areas 120A (the second sub-pixel area and the fourth sub-pixel area from left to right). It can be understood that in the first direction X, one second pixel circuit S2 is located between two first pixel circuits S1.

As shown in FIGS. 10B and 11A, in some embodiments, in the first direction X, two dummy sub-pixel areas 120B (the fourth sub-pixel area and the fifth sub-pixel area from left to right) are located between two normal sub-pixel areas 120A (the third sub-pixel area and the sixth sub-pixel area from left to right). It can be understood that in the first direction X, two second pixel circuits S2 are located between two first pixel circuits S1.

As shown in FIG. 10A, in some embodiments, in the first direction X, two normal sub-pixel areas 120A (the fourth sub-pixel area and the fifth sub-pixel area from left to right) are located between two dummy sub-pixel areas 120B (the third sub-pixel area and the sixth sub-pixel area from left to right). It can be understood that in the first direction X, two first pixel circuits S1 are located between two second pixel circuits S2 arranged in succession.

As shown in FIGS. 10B and 11A, in some embodiments, in the first direction X, one normal sub-pixel area 120A (the sixth sub-pixel area from left to right) is located between two dummy sub-pixel areas 120B (the fifth sub-pixel area and the seventh sub-pixel area from left to right). It can be understood that in the first direction X, one first pixel circuit S1 is located between two second pixel circuits S2 arranged in succession.

As shown in FIGS. 10B and 11A, in some embodiments, in the first direction X, three normal sub-pixel areas 120A (the ninth sub-pixel area, the tenth sub-pixel area, and the eleventh sub-pixel area from left to right) are located between two dummy sub-pixel areas 120B (the eighth sub-pixel area and the twelfth sub-pixel area from left to right). It can be understood that in the first direction X, three first pixel circuits S1 are located between two second pixel circuits S2 arranged in succession.

Figure 12:
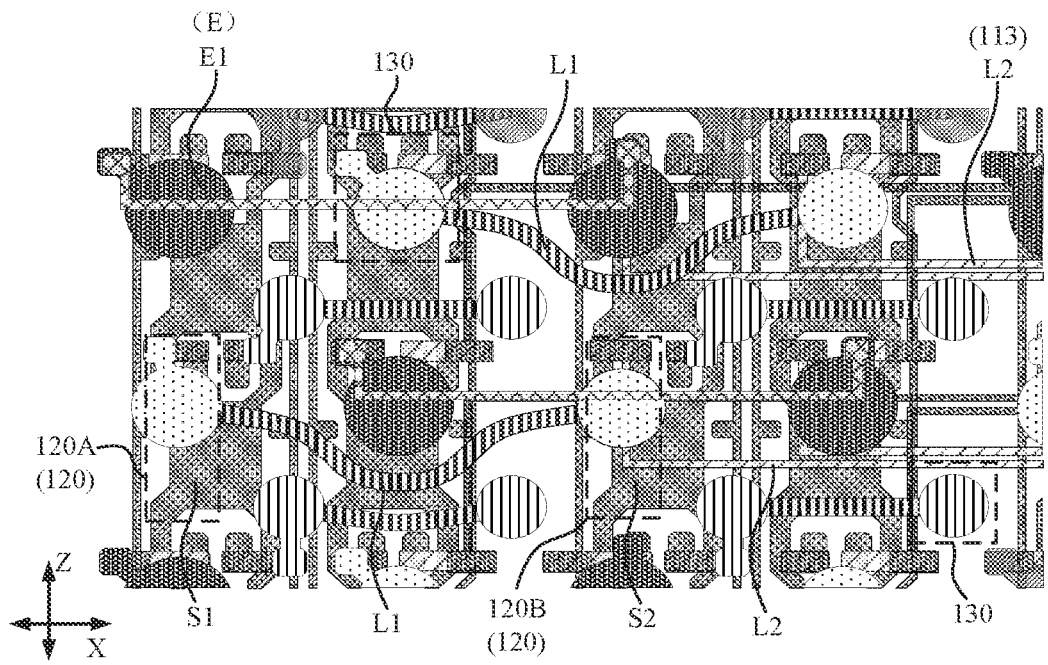
FIG. 12 is a partial structural diagram of a display substrate, in accordance with some embodiments.

FIG. 12 is a partial structural diagram of the display substrate in the transition region. FIG. 13 is a partial structure diagram of the display substrate at a boundary between the transition region and the light-transmissive display region.

As shown in FIGS. 11A, 11B, 12 and 13, in some embodiments, the display substrate 100 further includes first conductive lines L1. A first light-emitting device E1 is located in the same sub-pixel area 120B as a second pixel circuit S2, and a first pixel circuit S1 is coupled to the first light-emitting device E1 in the same sub-pixel area 120B as the second pixel circuit S2 through the first conductive line L1.

Referring to FIG. 11A, in the transition region AA11, a first pixel circuit S1 and a first light-emitting device E1 are located in a same sub-pixel area 120A, and a second pixel circuit S2 and another first light-emitting device E1 are also located in another same sub-pixel area 120B. It will be noted that FIG. 11A is merely an example of the arrangement. In other examples, the pixel circuits S (the first pixel circuit S1 and the second pixel circuit S2) and the first light-emitting devices E1 may be arranged in a misaligned manner.

As shown in FIG. 12, the first pixel circuit S1 is coupled to, through the first conductive line L1, the first light-emitting device E1 in the sub-pixel area 120B where the second pixel circuit S2 is located. It can be understood that the first pixel circuit S1 can drive the first light-emitting device E1 in the same sub-pixel area 120A as the first pixel circuit S1 to emit light, and also drive the coupled first light-emitting device E1 in the sub-pixel area 120B where the second pixel circuit S2 is located to emit light by using the first conductive line L1.

It will be noted that, as shown in FIG. 11A, the first light-emitting device E1 in the same sub-pixel area 120B as the second pixel circuit S2 in this embodiment is not driven by the second pixel circuit S2, but is driven by the first pixel circuit S1 coupled to first conductive line L1 to emit light. For example, the first light-emitting device E1, which is in the same sub-pixel area 120B as the second pixel circuit S2, obtains the anode voltage provided by the first pixel circuit S1 through the first conductive line L1.

As shown in FIGS. 12 and 13, the first conductive line L1 may be parallel to the first direction X in a case where there is no other light-emitting devices between two first light-emitting devices E1 to be connected. In a case where another light-emitting device E exists between the two first light-emitting devices E1 to be connected, the first conductive line L1 may bypass the another light-emitting device E to connect the two first light-emitting devices E1.

As shown in FIG. 11A, in some embodiments, the light-emitting device E includes an anode AE, a light-emitting layer OL, and a cathode layer CE stacked in sequence in a direction away from the substrate. At least one first conductive line L1 is disposed in the same layer as the anode AE of the light-emitting device E.

The first conductive line L1 is disposed in the same layer as the anode AE of the light-emitting device E. It can be understood as that in the manufacturing process of the display substrate, the first conductive line L1 and the anode AE of the light-emitting device E are simultaneously formed through a single patterning process. Alternatively, it can be understood as that the first conductive line L1 and the anode AE of the light-emitting device E are formed on the same film layer, for example, the first conductive line L1 and the anode AE of the light-emitting device E are formed on a planarization layer covering the plurality of pixel circuits.

The first conductive line L1 is disposed in the same layer as the anode AE, so that the first light-emitting device E1 located in the same sub-pixel area 120A with the first pixel circuit S1 is directly coupled to the first light-emitting device E1 located in the same sub-pixel area 120B with the second pixel circuit S2 through the first conductive line L1. There is no need to transmit the anode voltage across film layers. Therefore, the display substrate has a simple structure and high signal transmission efficiency.

The first conductive line L1 may include a metal material, such as copper Cu, silver Ag, aluminum Al, which is not limited here.

As shown in FIGS. 10A to 13, in some embodiments, the display substrate 100 may further include second conductive lines L2. The second pixel circuit S2 is coupled to the second light-emitting device E2 through the second conductive line L2. The second conductive line L2 is the above conductive line 113.

As shown in FIG. 13, in the light-transmissive display region AA2, the backside of the second light-emitting device E2 is bot provided with the pixel circuit S. The second light-emitting device E2 is coupled to the second pixel circuit S2 in the transition region AA11 through the second conductive line L2, so as to obtain the anode voltage for emitting light.

The second conductive line L2 may include a first segment located in the transition region AA11, and a second segment located in the light-transmissive display region AA2.

In some examples, the second conductive line L2 is a transparent conductive line as a whole, that is, the first segment of the second conductive line L2 and the second segment of the second conductive line L2 are both transparent conductive lines. For example, the first segment of the second conductive line L2 and the second segment of the second conductive line L2 are disposed in the same layer. The transparent conductive line may include the conductive line made of indium tin oxide (ITO) material.

The second conductive line L2 is the transparent conductive line, so that the structure of the display substrate may be simplified, and the manufacturing difficulty of the display substrate may be reduced.

In other examples, the first segment of the second conductive line L2 may be a metal conductive line, and the second segment of the second conductive line L2 may be a transparent conductive line. Moreover, the first segment of the second conductive line L2 and the second segment of the second conductive line L2 are connected through a via hole at a position of the transition region AA11 proximate to the light-transmissive display region AA2.

The first segment in the transition region AA11 is made of the conductive line, so that the conductivity of the first segment of the second conductive line L2 may be improved, and the overall conductivity of the second conductive line L2 may further be improved.

As shown in FIGS. 11A, 12 and 13, in some embodiments, the display substrate 100 includes the first conductive lines L1 and the second conductive lines L2 as described above. A first light-emitting device E1 and a second pixel circuit S2 are located in the same sub-pixel area 120B. The first light-emitting device E1 in the same sub-pixel area 120B as the second pixel circuit S2 is coupled to the first pixel circuit S1 in the normal sub-pixel area 120A through the first conductive line L1, and the color of the first light-emitting device E1 in the normal sub-pixel area 120A is different from the color of the second light-emitting device E2 coupled to the second pixel circuit S2 in the same sub-pixel area 120B as the first light-emitting device E1 through the second conductive line L2.

The two first light-emitting devices E1 in the two sub-pixel areas coupled by the first conductive line L1 have the same color.

In some examples, the color of the first light-emitting device E1 in the same sub-pixel area 120B as the second pixel circuit S2 is the first color. The first conductive line L1 is coupled to the first light-emitting device E1 and the first pixel circuit S1. The color of the first light-emitting device E1 in the sub-pixel area 120A where the first pixel circuit S1 is located and coupled to the first pixel circuit S1 is also the first color. The second conductive line L2 is coupled to the second pixel circuit S2 in the sub-pixel area 120B and the second light-emitting device E2 in the light-transmissive display region AA2, and the color of the second light-emitting device E2 is not the first color. For example, the color of the second light-emitting device E2 is the second color or the third color.

In some examples, a red first light-emitting device E1 and the second pixel circuit S2 are located in the same sub-pixel area 120B, and another red first light-emitting device E1 and the first pixel circuit S1 are located in the same sub-pixel area 120A. The first conductive line L1 is coupled to the first light-emitting device E1 in the sub-pixel area 120B and the first pixel circuit S1 in the sub-pixel area 120A. The second conductive line L2 is coupled to the second pixel circuit S2 in the sub-pixel area 120B and the second light-emitting device E2 in the light-transmissive display region AA2. The second light-emitting device E2 is the blue second light-emitting device E2 or the green second light-emitting device E2.

In some examples, a blue first light-emitting device E1 and the second pixel circuit S2 are located in the same sub-pixel area 120B, and another blue first light-emitting device E1 and the first pixel circuit S1 are located in the same sub-pixel area 120A. The first conductive line L1 is coupled to the first light-emitting device E1 in the sub-pixel area 120B and the first pixel circuit S1 in the sub-pixel area 120A. The second conductive line L2 is coupled to the second pixel circuit S2 in the sub-pixel area 120B and the second light-emitting device E2 in the light-transmissive display region AA2. The second light-emitting device E2 is the red second light-emitting device E2 or the green second light-emitting device E2.

As shown in FIG. 11A, in the fifth sub-pixel area from the left to the right, the light-emitting device E is the red first light-emitting device E1, and the pixel circuit S is the second pixel circuit S2. The red first light-emitting device E1 of in the fifth sub-pixel area is coupled to the first pixel circuit S1 in the first sub-pixel area through the first conductive line L1, and the light-emitting device E in the first sub-pixel are is the red first light-emitting device E1. The second pixel circuit S2 in the fifth sub-pixel area is coupled to the blue second light-emitting device E2 in the light-transmissive display region AA2.

In some other embodiments, the color of the first light emitting device E1 coupled to the first pixel circuit S1 through the first conductive line L1 may be the same as the color of the second light emitting device E2 coupled to the second pixel circuit S2 through the second conductive line L2.

In some examples, a green first light-emitting device E1 and the second pixel circuit S2 are located in the same sub-pixel area 120B, and another green first light-emitting device E1 and the first pixel circuit S1 are located in the same sub-pixel area 120A. The first conductive line L1 is coupled to the first light-emitting device E1 in the sub-pixel area 120B and the first pixel circuit S1 in the sub-pixel area 120A. The second conductive line L2 is coupled to the second pixel circuit S2 and the second light-emitting device E2, and the second light-emitting device E2 is another green second light-emitting device E2.

In some examples, the green first light-emitting device E1 is located in the same sub-pixel area 120B as the second pixel circuit S2, and the another green first light-emitting device E1 is located in the same sub-pixel area 120A as the first pixel circuit S1. The first conductive line L1 is coupled to the first light-emitting device E1 in the sub-pixel area 120B and the first pixel circuit S1 in the sub-pixel area 120A. The second conductive line L2 is coupled to the second pixel circuit S2 in the sub-pixel area 120B and the second light-emitting device E2 in the light-transmissive display region AA2. The second light-emitting device E2 is the green second light-emitting device E2.

As shown in FIG. 11A, in the fourth sub-pixel area from the left to the right, the light-emitting device E is the green first light-emitting device E1, and the pixel circuit S is the second pixel circuit S2. The green first light-emitting device E1 in the fourth sub-pixel area is coupled to the first pixel circuit S1 in the second sub-pixel area through the first conductive line L1, and the light-emitting device E in the second sub-pixel area is the green first light-emitting device E1. The second pixel circuit S2 in the fourth sub-pixel area is coupled to the green second light-emitting device E2 in the transmissive display region AA2.

As shown in FIGS. 10A, 10B and 11A, in some embodiments, the display substrate 100 may include a transparent conductive layer ITOL. In the second direction Y, the transparent conductive layer ITOL is located between the plurality of pixel circuits S and the plurality of light-emitting devices E. The second direction Y intersects the first direction X and is perpendicular to the display substrate 100. The transparent conductive layer ITOL includes the second conductive lines L2.

The transparent conductive layer ITOL may be a single-layer structure. Alternatively, the transparent conductive layer ITOL may be a multi-layer structure. For example, in the second direction Y, the transparent conductive layer ITOL includes a plurality of transparent conductive films (e.g., three transparent conductive films ITO1 to ITO3) that are arranged sequentially, and two adjacent transparent conductive films are spaced from each other by an insulating layer.

In some examples, the transparent conductive layer ITOL includes three transparent conductive films ITO1 to ITO3. Orthographic projections of any two transparent conductive films on the substrate of the display substrate 100 overlap, and alternate with an orthographic projection of the remaining transparent conductive film on the substrate.

For example, an orthographic projection of a first transparent conductive film ITO1 on the substrate may overlap with an orthographic projection of a second transparent conductive film ITO2 on the substrate, and the orthographic projection of the first transparent conductive film ITO1 on the substrate may be arranged alternately with an orthographic projection of a third transparent conductive film ITO3 on the substrate in a third direction Z. The orthographic projection of the second transparent conductive film ITO2 on the substrate may also be arranged alternately with the orthographic projection of the third transparent conductive film ITO3 on the substrate in the third direction Z.

For another example, the orthographic projection of the first transparent conductive film ITO1 on the substrate may overlap with the orthographic projection of the third transparent conductive film ITO3 on the substrate, and the orthographic projection of the first transparent conductive film ITO1 on the substrate may be arranged alternately with the orthographic projection of the second transparent conductive film ITO2 on the substrate in the third direction Z. The orthographic projection of the second transparent conductive film ITO2 on the substrate may also be arranged alternately with the orthographic projection of the third transparent conductive film ITO3 on the substrate in the third direction Z.

In some examples, the light transparent conductive layer ITOL may be a patterned transparent conductive pattern. The transparent conductive pattern includes a plurality of second conductive lines L2 connected to the second light-emitting devices E2 of different colors, and the plurality of second conductive lines L2 are insulated from each other.

In some other examples, the transparent conductive layer ITOL includes the plurality of transparent conductive films ITO1 to ITO3 that are arranged to be insulated from each other in the second direction Y. Each transparent conductive films is a patterned transparent conductive pattern, and different transparent conductive films include the second conductive lines L2 coupled to the light-emitting devices of different colors. The second conductive lines L2 coupled to the light-emitting devices E of the same color are in the same transparent conductive film.

For example, as shown in FIG. 11A, the display substrate 100 includes the red light-emitting device E, the green light-emitting device E, and the blue light-emitting device E, and the transparent conductive layer includes the first transparent conductive film ITO1, the second transparent conductive film ITO2, and the third transparent conductive film ITO3 that are disposed to be insulated from each other. The first transparent conductive film ITO1, the second transparent conductive film ITO2, and the third transparent conductive film ITO3 are arranged sequentially in the second direction Y. The first transparent conductive film ITO1 includes second conductive lines L2 coupled to the green second light-emitting devices E2, the second transparent conductive film ITO2 includes second conductive lines L2 coupled to the red second light-emitting devices E2, and the third transparent conductive film ITO3 includes second conductive lines L2 coupled to the blue second light-emitting devices E2.

The plurality of transparent conductive films may each include a different number of second conductive lines L2. For example, in a case where the pixel unit includes a red sub-pixel, two green sub-pixels, and a blue sub-pixel, the number of the second conductive lines L2 in the first transparent conductive film ITO1 may be greater than the number of the second conductive lines L2 in the second transparent conductive film ITO2, and may also be greater than the number of the second conductive lines L2 in the third transparent conductive film ITO3.

As shown in FIG. 11A, in some embodiments, two second light-emitting devices E2 of the same color are connected to the two second pixel circuits S2, respectively. A second light-emitting device E2 of the two second light-emitting devices E2 proximate to the main display region AA1 is coupled to a second pixel circuit S2 of the two second pixel circuits S2 proximate to the light-transmissive display region AA2, and a second light-emitting device E2 of the two second light-emitting devices E2 far away from the main display region AA1 is coupled to a second pixel circuit S2 of the two second pixel circuits S2 far away from the light-transmissive display region AA2.

It can be understood that two second light-emitting devices E2 of the same color are respectively coupled to two pixel circuits of the same type. The second light-emitting device E2 and the second pixel circuit S2 that are short in distance are coupled through a second conductive line L2, and the second light-emitting device E2 and the second pixel circuit S2 that are long in distance are coupled through another second conductive line L2.

For example, as shown in FIG. 10A, the sixth sub-pixel area and the twelfth sub-pixel area from left to right in the transition region AA11 are two dummy sub-pixel areas 120B, and the second pixel circuits S2 in the two dummy sub-pixel areas 120B are both the pixel circuits S− of the second type. The second pixel circuit S2 in the sixth sub-pixel area is coupled to the first second light-emitting device E2 from right to left in the light-transmissive display region AA2, and the second pixel circuit S2 in the twelfth sub-pixel area is coupled to the third second light-emitting device E2 from right to left in the light-transmissive display region AA2. The first second light-emitting device E2 and the third second light-emitting device E2 are of the same color.

For another example, as shown in FIG. 10B, the fourth sub-pixel area and the eighth sub-pixel area from left to right in the transition region AA11 are two dummy sub-pixel areas 120B, and the second pixel circuits S2 in the two dummy sub-pixel areas 120B are both the pixel circuits S− of the second type. The second pixel circuit S2 in the fourth sub-pixel area is coupled to the first second light-emitting device E2 from right to left in the light-transmissive display region AA2, and the second pixel circuit S2 in the eighth sub-pixel area is coupled to the third second light-emitting device E2 from right to left in the light-transmissive display region AA2. The first second light-emitting device E2 and the third second light-emitting device E2 are of the same color.

Figure 14:
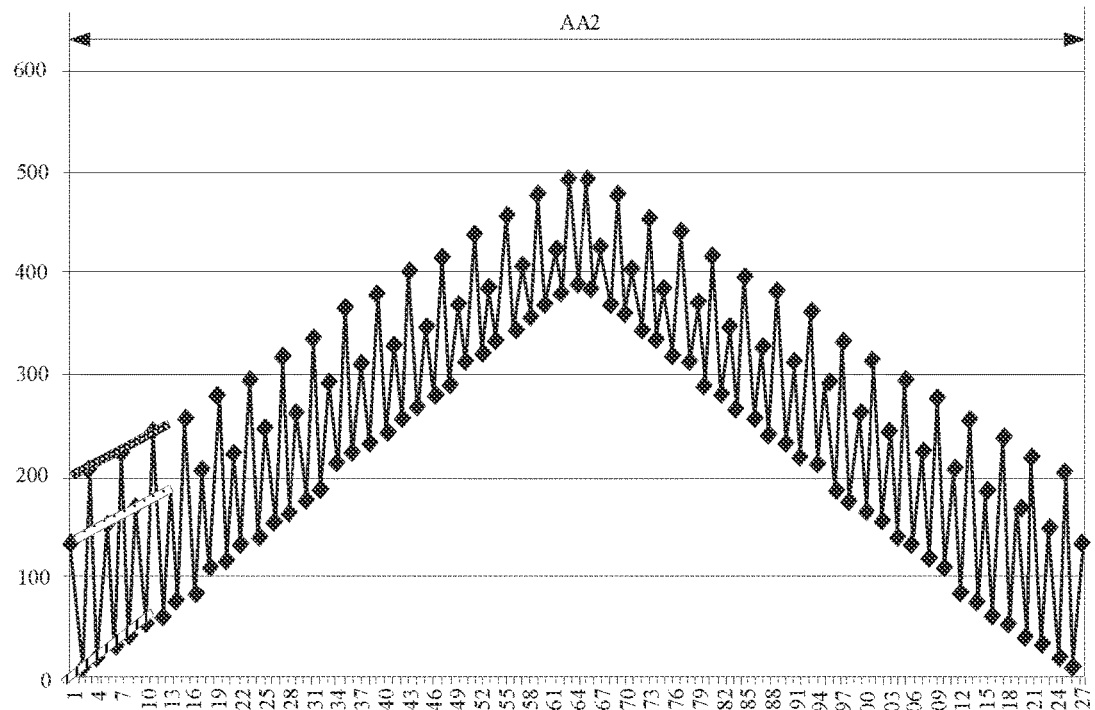
FIG. 14 is a graph showing variation of parasitic capacitance in a display substrate, in accordance with some embodiments.

In this way, the overlapping positions where the orthographic projections of the plurality of second conductive lines L2 on the substrate cross each other may be optimized, so that the overlapping positions have a gradually varied characteristic, that is, the arrangement density of the overlapping positions gradually increases or gradually decreases. Since the parasitic capacitance generated by the overlapping of the second conductive lines L2 may cause the display substrate 100 to display dark fringes, the gradual varied arrangement may make the arrangement positions of the parasitic capacitance in the light-transmissive display region AA2 may have a gradually varied characteristic, as shown in FIG. 14, that is, the parasitic capacitance gradually increases or gradually decreases. As a result, the display of the dark fringes also has a gradually varied characteristic, that is, the density of the dark fringes gradually increases or gradually decreases.

FIG. 14 shows the capacitance arrangement of positions in the entire light-transmissive display region AA2. The capacitance at the edge positions in the light-transmissive display region AA2 is lower, and the capacitance at the middle position in the light-transmissive display region AA2 is high. It can be seen that the capacitance changes at different positions are gradually varied, the concealment of dark fringe display may be improved, and obvious brightness difference change will not occur, so that poor display caused by the dark fringes may not be viewed by human eyes, and the display effect of the display substrate may be improved.

In summary, in the display substrate 100 provided by the embodiment of the disclosure, the at least two second light-emitting devices E2, of the same color and arranged in succession, in the light-transmissive display region AA2 may obtain the anode voltages generated by the transistors with the same characteristics, and thus the light with the same color and the similar brightness may be emitted, thereby improving the display effect of the display apparatus.

As shown in FIG. 1, some embodiments of the present disclosure provide a display apparatus 1000. The display apparatus 1000 includes a display substrate 100 and an optical sensor 200. The display substrate 100 is the display substrate 100 as described in any of the above embodiments.

The display substrate 100 includes a display surface 100A for emitting light, and a back surface 100B disposed opposite to the display surface 100A. The optical sensor 200 is located on a side of the back surface 100B of the display substrate 100, and the light-collecting side of the optical sensor 200 faces the back surface 100B of the display substrate 100.

The light-collecting region of the optical sensor 200 at least partially overlaps with the light-transmissive display region AA2 of the display substrate 100, so that the optical sensor 200 can collect an image (e.g., a human face image, or a scene) at the side of the display surface 100A of the display substrate 100 through the light-transmissive display region AA2 of the display substrate 100.

In some examples, an orthographic projection of an edge of the light-collecting region of the optical sensor 200 on the display substrate 100 substantially overlaps with an edge of the light-transmissive display region AA2.

In some examples, the optical sensor 200 may be a camera.

Since the display apparatus 1000 has the display substrate 100 provided in any of the above embodiments, the display apparatus 1000 has the beneficial effects of the display substrate 100 provided in any of the above embodiments, and details are not repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a main display region and a light-transmissive display region, the main display region being located on at least one side of the light-transmissive display region; the display substrate comprising:
a plurality of pixel circuits located in the main display region, wherein the plurality of pixel circuits include first pixel circuits and second pixel circuits; the first pixel circuits include pixel circuits of a first type and pixel circuits of a second type, and the second pixel circuits include pixel circuits of the first type and pixel circuits of the second type; in the plurality of pixel circuits, one of two adjacent pixel circuits in a first direction is a pixel circuit of the first type, and another of the two adjacent pixel circuits is a pixel circuit of the second type; the pixel circuit of the first type and the pixel circuit of the second type have different structures; and
a plurality of light-emitting devices including first light-emitting devices located in the main display region and second light-emitting devices located in the light-transmissive display region, wherein the first light-emitting devices are coupled to the first pixel circuits, and the second light-emitting devices are coupled to the second pixel circuits, wherein
in the first direction, at least two second light-emitting devices of a same color and arranged in succession are both coupled to at least one pixel circuit of a same type in the second pixel circuits.

2. The display substrate according to claim 1, wherein all second light-emitting devices of the same color are each coupled to a pixel circuit of the first type in the second pixel circuits; or
all the second light-emitting devices of the same color are each coupled to a pixel circuit of the second type in the second pixel circuits.

3. The display substrate according to claim 1, wherein at least one second pixel circuit is coupled to at least one second light emitting device.

4. The display substrate according to claim 1, wherein
a single second pixel circuit is coupled to a single second light-emitting device; or
the single second pixel circuit is coupled to the at least two second light-emitting devices of the same color.

5. The display substrate according to claim 1, wherein the light-transmissive display region of the display substrate includes a plurality of display unit areas, and a display unit area includes a plurality of second light-emitting devices in the second light-emitting devices located in the light-transmissive display region; and
two second light-emitting devices belonging to two adjacent display unit areas and of the same color are coupled to a same second pixel circuit.

6. The display substrate according to claim 1, wherein the light-transmissive display region of the display substrate includes a plurality of display unit areas, and a display unit area includes two second light-emitting devices of the same color; and
the two second light-emitting devices of the same color in the display unit area are coupled to a same second pixel circuit.

7. The display substrate according to claim 1, further comprising first conductive lines, wherein the main display region of the display substrate includes a plurality of sub-pixel areas;
a first light-emitting device and a second pixel circuit are located in a same sub-pixel area; and
a first pixel circuit is coupled to the first light-emitting device located in the same sub-pixel area as the second pixel circuit through a first conductive line.

8. The display substrate according to claim 7, wherein a light-emitting device includes an anode, a light-emitting layer and a cathode layer that are sequentially stacked in a direction away from the substrate; and
at least one first conductive line is disposed in a same layer as the anode of the light-emitting device.

9. The display substrate according to claim 1, further comprising second conductive lines, wherein
a second pixel circuit is coupled to a second light-emitting device through a second conductive line.

10. The display substrate according to claim 9, further comprising first conductive lines, wherein the main display region of the display substrate includes a plurality of sub-pixel areas;
a first light-emitting device and the second pixel circuit are located in a same sub-pixel area;
the first light-emitting device in the same sub-pixel area as the second pixel circuit is coupled to a first pixel circuit in another sub-pixel area through a first conductive line, and a color of another first light-emitting device in the another sub-pixel area is different from a color of the second light-emitting device to which the second pixel circuit located in the same sub-pixel area as the first light-emitting device is coupled through the second conductive line.

11. The display substrate according to claim 9, wherein the display substrate comprises a transparent conductive layer:
in a second direction, the transparent conductive layer is located between the plurality of pixel circuits and the plurality of light-emitting devices; the second direction intersects the first direction and is perpendicular to the display substrate; and
the transparent conductive layer includes the second conductive lines.

12. The display substrate according to claim 11, wherein the transparent conductive layer includes a plurality of transparent conductive films disposed to be insulated from each other in the second direction; and
different transparent conductive films include second conductive lines coupled to second light-emitting devices of different colors, and second conductive lines coupled to second light-emitting devices of the same color are located in a same transparent conductive film.

13. The display substrate according to claim 1, wherein two second light-emitting devices of the same color are connected to two second pixel circuits, respectively;
a second light-emitting device of the two second light-emitting devices proximate to the main display region is coupled to a second pixel circuit of the two second pixel circuits proximate to the light-transmissive display region; and
another second light-emitting device of the two second light-emitting devices far away from the main display region is coupled to another second pixel circuit of the two second pixel circuits far away from the light-transmissive display region.

14. The display substrate according to claim 1, wherein in two adjacent second pixel circuits in the first direction, a pixel circuit of the first type and a pixel circuit of the second type are coupled to second light-emitting devices of different colors, respectively.

15. The display substrate according to claim 1, wherein a first light-emitting device and a second light-emitting device of a same color are coupled to a pixel circuit of the first type in the first pixel circuits and a pixel circuit of the first type in the second pixel circuits, respectively; or
the first light-emitting device and the second light-emitting device of the same color are coupled to a pixel circuit of the second type in the first pixel circuits and a pixel circuit of the second type in the second pixel circuits, respectively.

16. The display substrate according to claim 1, wherein the light-transmissive display region of the display substrate includes a plurality of display unit areas, and a display unit area includes one second light-emitting device of a first color, two second light-emitting devices of a second color and one second light-emitting device of a third color; and
the second light-emitting device of the first color and the second light-emitting device of the third color are each coupled to a pixel circuit of the first type in the second pixel circuits; and
the second light-emitting devices of the second color are each coupled to a pixel circuit of the second type in the second pixel circuits.

17. The display substrate according to claim 1, wherein the pixel circuit of the first type and the pixel circuit of the second type that are adjacent in the first direction are two pixel circuits arranged in a mutual mirror image manner.

18. The display substrate according to claim 1, wherein in the first direction, at least one second pixel circuit is located between two first pixel circuits; and/or
in the first direction, at least one first pixel circuit is located between two second pixel circuits.

19. The display substrate according to claim 1, wherein the main display region includes a transition region and a remaining display region;
the transition region at least partially surrounds the light-transmissive display region;
the remaining display region at least partially surrounds the transition region; and
the second pixel circuits are located at least in the transition region, and the first pixel circuits are located in the remaining display region and the transition region.

20. A display apparatus, comprising:
the display substrate according to claim 1;
an optical sensor located on a side of a back surface of the display substrate, the back surface of the display substrate being a surface opposite to a display surface of the display substrate, wherein
a light-collecting region of the optical sensor at least partially overlaps with the light-transmissive display region of the display substrate.

* * * * *